United States Patent [19]

Shanks

[11] 4,326,279
[45] Apr. 20, 1982

[54] ANALOGUE DISPLAYS

[75] Inventor: Ian A. Shanks, Malvern, England

[73] Assignee: National Research Development Corporation, London, England

[21] Appl. No.: 115,535

[22] Filed: Jan. 25, 1980

[30] Foreign Application Priority Data

Jan. 26, 1979 [GB] United Kingdom ............... 02941/79

[51] Int. Cl.³ .......................... G04C 17/02; G06F 3/14
[52] U.S. Cl. .................................... 368/240; 368/242; 340/765; 340/805
[58] Field of Search .................... 368/82, 84, 239, 240, 368/242; 340/756, 765, 784, 805; 350/332

[56] References Cited

U.S. PATENT DOCUMENTS

| | | | |
|---|---|---|---|
| 3,894,389 | 7/1975 | Miura et al. ..................... | 368/239 X |
| 4,117,472 | 9/1978 | Freer et al. .......................... | 340/805 |
| 4,119,367 | 10/1978 | Raynes et al. ...................... | 340/784 |
| 4,186,395 | 1/1980 | Fujita et al. ......................... | 340/805 |
| 4,203,104 | 5/1980 | Kmetz .................................. | 340/754 |
| 4,212,011 | 7/1980 | Waldron ............................. | 340/784 |
| 4,212,159 | 7/1980 | Noble et al. ......................... | 368/82 |
| 4,227,193 | 10/1980 | Shanks ................................. | 340/784 |
| 4,250,503 | 2/1981 | Shanks ................................. | 340/754 |

FOREIGN PATENT DOCUMENTS 1472247 5/1977 United Kingdom .
1478592 7/1977 United Kingdom .

Primary Examiner—Vit W. Miska
Attorney, Agent, or Firm—Pollock, Vande Sande & Priddy

[57] ABSTRACT

An analogue display includes an electrical sensitive medium enclosed between two sets of electrodes. The two sets of electrodes are registered and overlap to provide background and one or more shaped index characters, each at a plurality of selectable positions. Voltage signals are applied to the electrodes so that the medium is held in an OFF state in the region between selected electrodes, while simultaneously voltage signals are applied so that in other regions of the medium, the medium is in an ON state. The medium may be of liquid crystal, electroluminescent or gaseous material. One set of electrodes may have a meander configuration, the other set a segmented configuration. The index character or characters may be displayed at one, two or three positions, each character being of different shape, for meter or timepiece applications. The voltage signals applied may be binary coded and in preference pseudo-random sequence binary codes.

21 Claims, 16 Drawing Figures

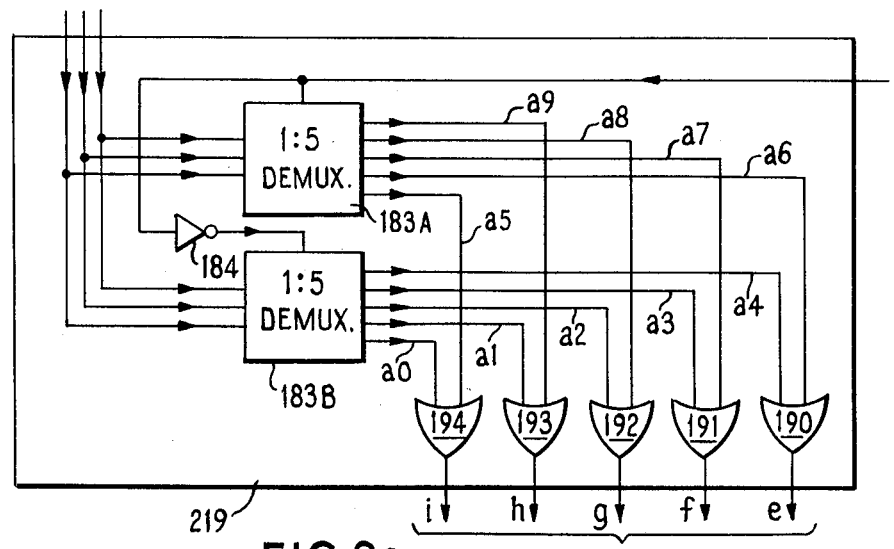
FIG.9c  TO MUX. 151 TO 155
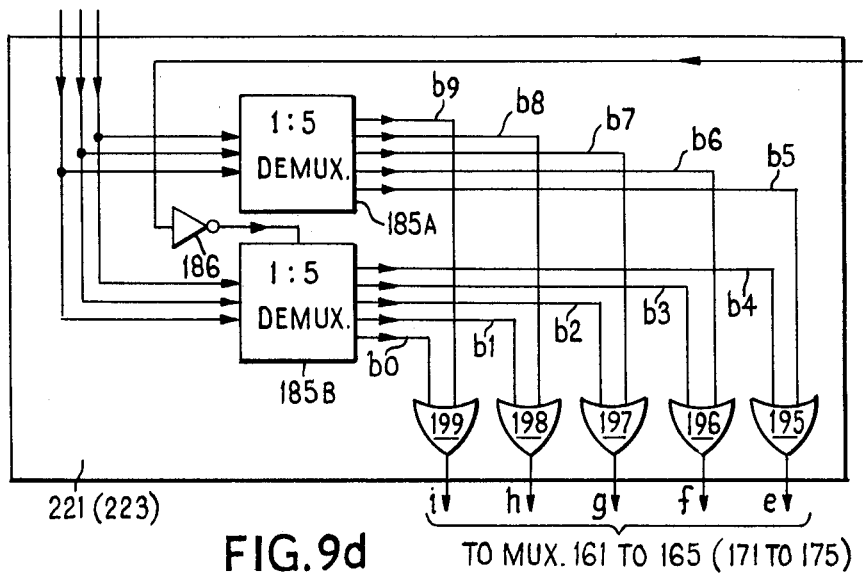
FIG.9d  TO MUX. 161 TO 165 (171 TO 175)

ANALOGUE DISPLAYS

This invention concerns analogue displays, for example timepieces (i.e., watches or clocks) and analogue meter displays having dial, arc or recti-linear scales where one or more scalar quantities are each represented by the relative position of an index against an optically contrasting background.

Analogue watches and analogue meter displays have typically been of either mechanical or electromechanical construction. An example of a display of non-mechanical construction, a liquid crystal device analogue watch having a radial display format has recently been described (cf. Conference Record of the IEEE Biennial Display Research Conference Oct. 24–26, 1978, pp 59–61). As thus described, a set of meander electrodes overlap two sets of segment electrodes across a liquid crystal cell and are addressed using $\frac{1}{2}$-duty cycle time-multiplexing to allow the simultaneous display of both hour and minute indices. By appropriate electrical address the voltage across electrodes defining the index position, in each case, is of such value above a threshold value, characteristic of the liquid crystal material, that a localized region of the liquid crystal material is switched ON and adopts a state providing optical contrast with the adjacent and remaining parts of the display where voltage differences less than but near threshold are applied. This allows the number of connections to the display to be reduced compared to the number required to make individual connection to each directly driven active area of the display.

The case generally found with time-multiplexed liquid crystal devices is that the OFF elements have applied across them a voltage difference less than but close to the threshold voltage of the effect used. It is a problem that this threshold voltage may vary with temperature causing either the operative temperature range of the display to be restricted, or temperature compensation of drive voltage levels to be required, with consequent electronic complexity.

Also, variation with the angle of view of the threshold voltage $V_t$ and the saturation voltage $V_{sat}$ may cause the viewing angle of the display to be severely restricted. Furthermore, the variation of the parameters $V_t$, $V_{sat}$ with the local thickness of the display often necessitates excessively stringent tolerance of liquid crystal material layer thickness.

With the time-multiplexed address of a display, the finite voltage differences applied across OFF elements being generally near threshold, may in certain types of liquid crystal device displays—e.g. cholesteric-nematic phase change effect cells incorporating pleochroic dyes—result in poor contrast and very slow dynamic response to changes in the electrical address.

The invention here provides an alternative approach to the construction of analogue displays.

According to the invention an analogue display comprises:

a display panel including an electrically sensitive medium between two sets of electrodes, the medium being capable of adopting in different regions thereof each of two optical states, an ON state and an OFF state respectively, according to the electrical voltage differences applied thereacross when voltage signals are applied to the electrodes, the electrodes having such configuration, and being arranged, to provide by overlap of these sets a plurality of selectable index positions;

panel drive means for generating the voltage signals; and, selection means, responsive to control for selecting particular voltage signals, arranged to apply these particular signals in a controlled and select manner to the electrodes of at least one of the two sets thereof;

and wherein the display is constructed and arranged such that, under control, like signals are applied to at least one electrode of each set so that at, at least one selected index position, zero voltage difference is applied across the corresponding region of the medium so that it is maintained in the OFF state, and, simultaneously, other signals are applied so that at non-selected index positions a finite voltage difference, greater than a threshold voltage characteristic of the panel, is applied across other corresponding regions of the medium so that these regions are maintained in the ON state, an index character being displayed in optical contrast against display panel background at each selected position.

The display panel may be in the form of a liquid crystal cell wherein the medium is of liquid crystal material. This form of panel may include one or more polarizers and be adapted as a twisted nematic (Schadt-Helfrich) cell in which a thin layer of nematic liquid crystal material is contained between transparent electrode-bearing glass plates, the latter being treated by undirectional rubbing and assembled with the directions of rubbing orthogonal or twisted to give a twisted alignment of the liquid crystal molecules of the layer. However, the electrode-bearing plates may be treated in other known manners such as by oblique evaporation of dielectric material eg. SiO or $MgF_2$, to facilitate alignment. Small amounts of cholesteric material (typically 1%) may be added to the nematic liquid crystal material to prevent display non-uniformity. For further discussion of this, see UK Pat. Nos. 1,472,247 and 1,478,592; and also small amounts of pleochroic dye may be added, to give a colored display and allow one or both polarizers to be omitted, as known in the art. Alternatively, this form of panel may be adapted as a cholesteric to nematic phase change cell including a thin layer of cholesteric material which is characterized by two phase states; one, the OFF state wherein the material in the focal conic texture has the property of scattering incident light; the other, the ON state, wherein the material molecules are aligned by the electric field into the nematic phase and enable the transmission of incident light through the layer. A small amount of pleochroic dye may be added to the liquid crystal material to enhance contrast and viewability. In this case the OFF state may alternatively be the (nonscattering) planar texture of the cholesteric.

The display panel may be an ac electroluminescent panel wherein the medium is in the form of a solid layer of electroluminescent material. Alternatively the display panel may be an ac plasma discharge panel wherein the medium is a suitable gas.

Conveniently, the selectable index positions may be provided by the overlap of two sets of electrodes comprising one set of electrodes having a meander or modified meander configuration, the other set of electrodes having a segmented configuration. These electrodes may be shaped and the sets arranged to enable display of a single index character. Alternatively the set of electrodes having a segmented configuration may comprise a plurality of segments so shaped and the sets may be so arranged to allow the simultaneous display of distinctive index characters. In the latter case the set of electrodes having a meander or, modified meander, configuration may comprise sub-sets of electrodes, each subset being arranged in register with the shaped segments for display of a different one of the distinctive index characters.

The sets of electrodes having meander (or modified meander) and segmented configuration, respectively, may be arranged to form a circular dial, an arc, or a rectilinear, display area. These methods of construction together with the method of driving allow the number of display connections to be reduced considerably without the need to time multiplex and allow the display to be directly driven ie. the OFF state has zero voltage applied and the ON state has a selectably high applied voltage.

The display may also include control means for controlling selection. For example, the display may be a timepiece wherein the control means comprises: an oscillator for providing a series of regular clock pulses; and, a divider chain, responsive to the oscillator, adapted to provide control data for controlling the selection means. As a further example, the display may be a meter wherein the control means includes an input transducer and a data source, responsive to the transducer, adapted to provide control data for controlling the selection means.

In a preferred construction and arrangement of the analogue display, the panel drive means is adapted to provide a set of N discrete alternating voltage signals, and is arranged to apply a different signal of this set of signals to each electrode of one of the two sets of electrodes; the selection means is responsive to control and, under control, selects a particular subset consisting of one or more of the applied signals, and applies these signals to an appropriate one or more selected electrodes of the other set, while applying simultaneously to the non-selected electrodes of this other set at least one voltage signal, of the set of signals, which is different from the applied signals; and wherein the set of signals ($V_i$, $i=1, \ldots, N$) has the following properties:

(i) each repetitive signal has a period T, or a submultiple of T for its repetition.

(ii) the voltage difference between any two signals ($V_i$, $V_j$ say) is truly alternating in the period T, $$<V_i - V_j>_T = 0,$$

the period T being of sufficiently short duration that the medium responds to the RMS value of the voltage difference in each case, and irreversible electrochemical decomposition effects are avoided, (iii) the RMS voltage difference between any two signals is not less than a minimum voltage ($V_{min}$):

$$(V_i - V_j)_{RMS} \geq V_{min}, i \neq j, i, j = 1, 2, \ldots N$$

this minimum voltage being significantly greater than threshold $V_t$ (ie. $V_{min} \geq 1.5 V_t$).

To facilitate use of the display over an extended range of temperature, it is preferable that the finite RMS voltage difference in each case is somewhat greater than the saturation voltage $V_{sat}$ at the mean operative temperature, $$V_{min} \gtrsim 1.1 V_{sat}$$

The saturation voltage of the panel is that voltage difference applied across the medium that is required to change the relevant optical property (eg optical transmission) of the corresponding region by 90% of the full property change possible.

Furthermore to facilitate wide angle of view and a uniform appearance of the display it is preferable that the RMS voltage difference is in each case equal to a common minimum voltage:

$$(V_i - V_j)_{RMS} = V_{min}, \text{ all } i \neq j$$

Conveniently, the set of signals may be a set of pseudo-random binary sequence signals, each of period T and divided into a plurality of L bits ($L \geq N$), with each bit having a value logic '0' or '1', corresponding to two different levels of voltage. Alternatively the signals may be a set of suitable Walsh function signals.

Embodiments of the invention will now be described, by way of example only, and with reference to the accompanying drawings of which:

Figure 10:
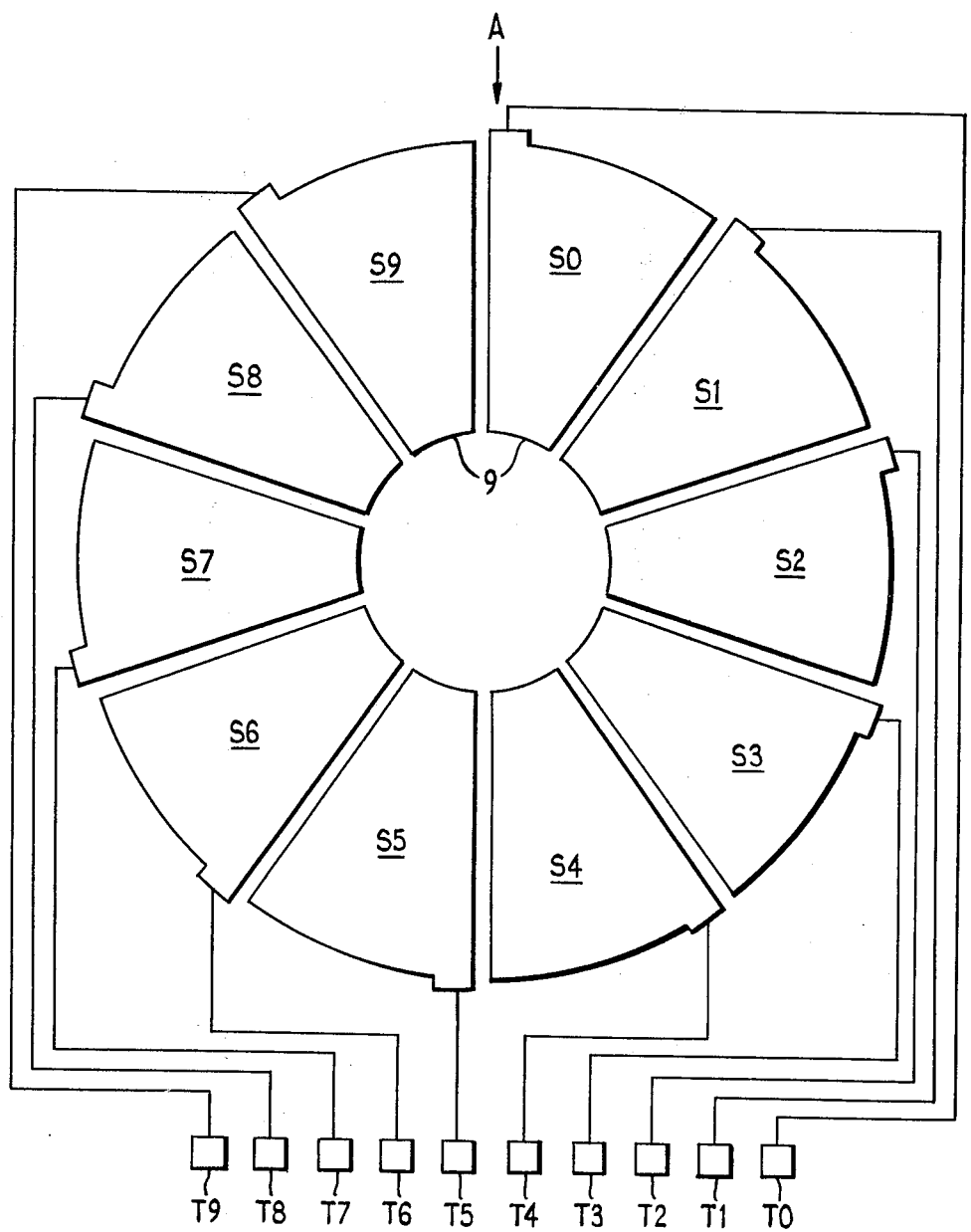
Figure 11A:
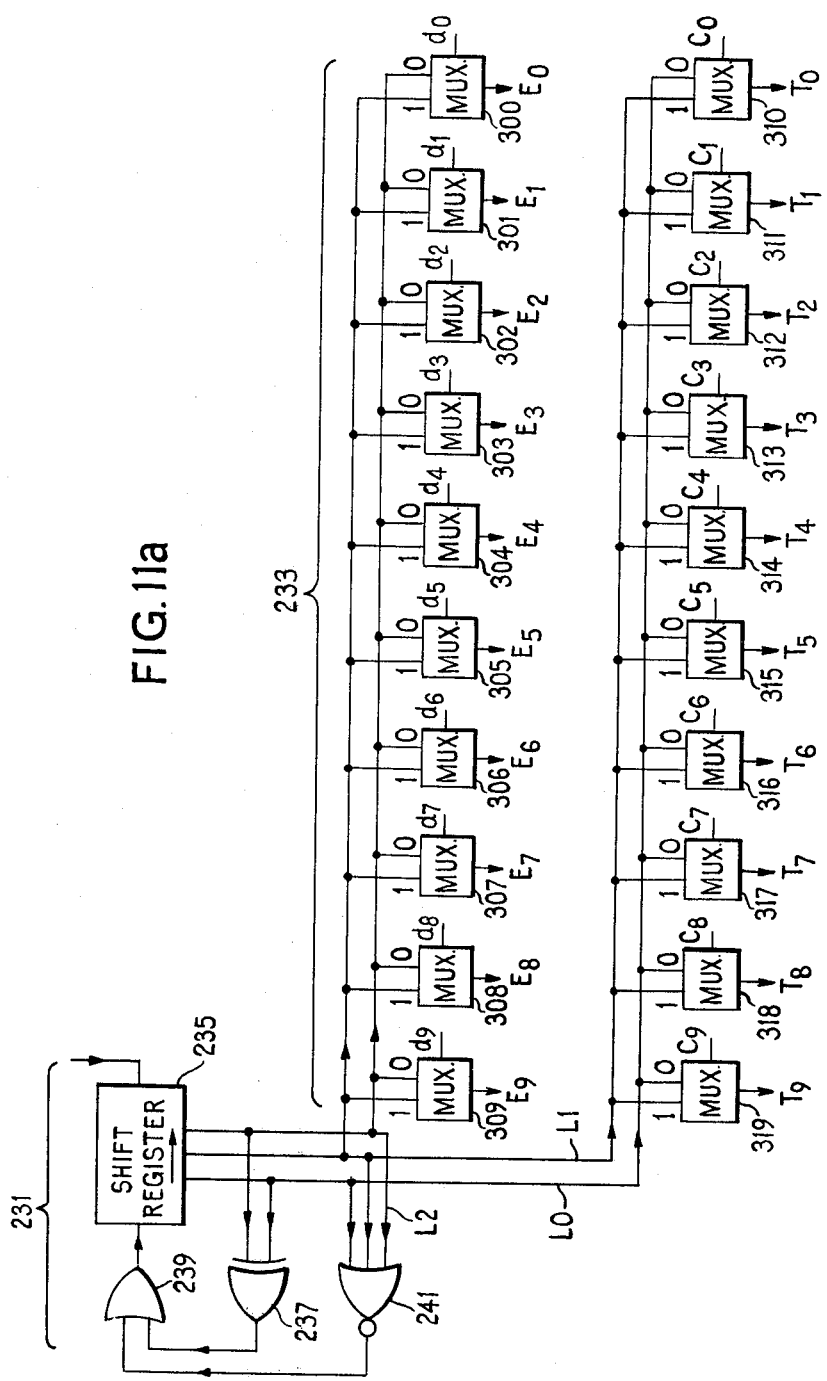
Figure 11B:
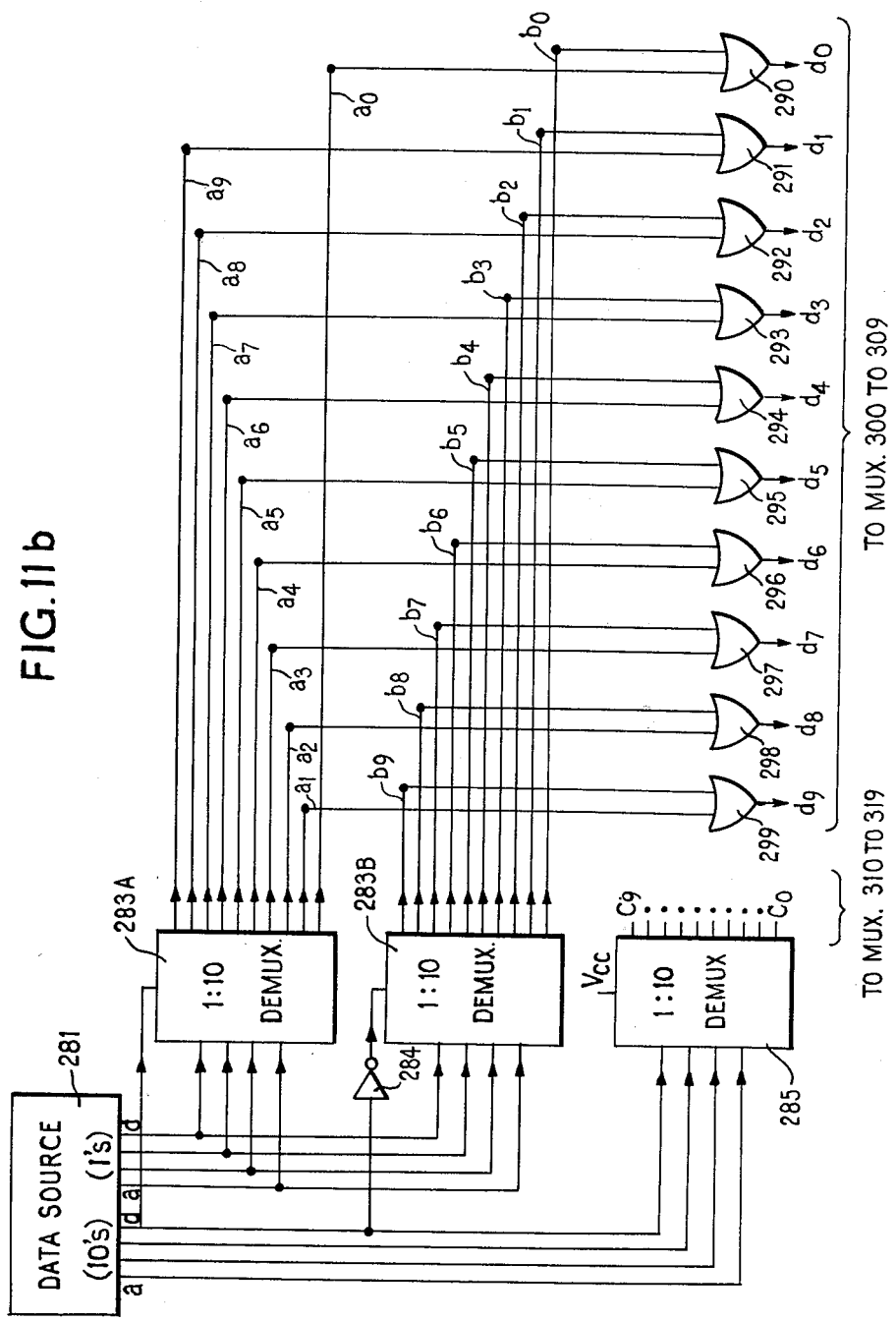

FIGS. 9a to d are circuit layout diagrams illustrating an arrangement of electronic components for operation of a display panel constructed as described below with reference to FIGS. 1, and FIGS. 6 to 8;

FIG. 10 is a plan view of another alternative arrangement of the back plate electrodes of the display panel shown in FIG. 1; and FIGS. 11a and 11b are circuit layout diagrams illustrating an arrangement of electronic components for operation of a display panel constructed as described below with reference to FIGS. 1, 4 and 10.

Figure 1:
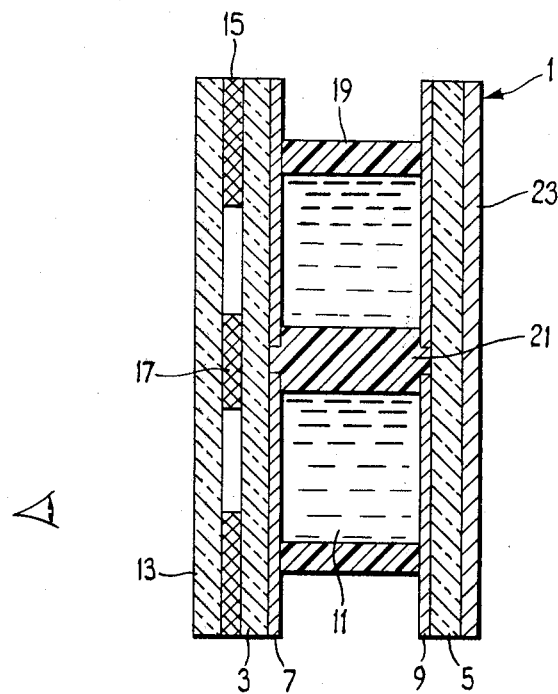
FIG. 1 is a cross-section of a display panel including front and back-plate electrodes.

There is shown in FIG. 1 a display panel 1 having parallel front and back glass plates 3, 5 bearing on their inner facing surfaces electrode structures 7, 9. These structures may be formed by conventional photolithographic techniques and of these structures, at least the front structure 7 is transparent and may be of tin oxide or other suitable conductive material. (A typical tin oxide film thickness is $\sim 10^4$ Å with resistivity $\sim 1$ to $1000 \Omega/\square$). The plates 3, 5 are spaced apart and have, in the space between, an electrically sensitive medium 11, the medium being characterized by the property that, in regions where the two electrode structures overlap, it may be changed from one optical state (eg opaque) to another (eg transparent), when suitable voltages are applied to the electrodes of each of the structures 7, 9. In front of the front plate 3 there is a cover glass 13 and between these an opaque graduated scale 15 and a central masking blank 17.

Though the medium 11 may be a solid layer of electroluminescent material, as in the case of an electroluminescent display panel; or, a rarefied gas, as in the case of an AC plasma discharge panel; for the purposes of this example it is a layer of liquid crystal material. The display panel thus adapted, is in the form of a liquid crystal cell where the liquid crystal material is enclosed in the space between the glass plates 3, 5 by a peripheral spacer 19 of insulating material. For added rigidity there is also a central support 21, also of insulating material. The plates 3, 5 are spaced apart by a short distance, typically of the order of 12 μm, to allow surface effect alignment of the liquid crystal material molecules to propagate across the width of the cell. To facilitate initial alignment of these molecules, the electrode bearing plates 3, 5 may be assembled: after unidirectionally rubbing, or, coating the electrodes by suitable oblique evaporation; or after treatment with a surfactant, such as organo-silane or lecithin, according to the liquid crystal effect used to define the different optical states, and the alignment required for display.

In particular, for a cell using the cholesteric-to-nematic phase change effect the liquid crystal material is cholesteric and the plates may be treated by surfactant to give focal conic alignment. Examples of suitable cholesteric mixtures for such a cell are the mixtures:

E8* (nematic) with approx 6 wt % CB 15* (cholesteric), or

E18* (nematic) with approx 6 wt % CB 15* (cholesteric),

Preferably these cholesteric materials include in addition a small amount of pleochroic dye. For example an anthraquinone dye such as D16*;

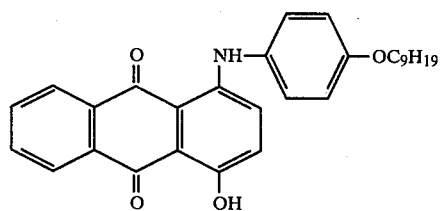
D16

+The materials E8, E18, CB15, and dye D16 are listed in the trade catalogues of BDH Ltd, Poole, Dorset, England.

or one or more of the azodyes (a) to (c) appearing below, of which the colors are (a) orange-red, (b) blue, and (c) magenta:

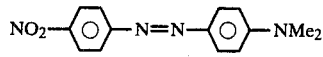 (a)

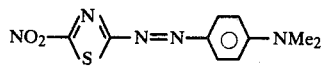 (b)

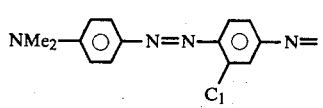 (c)

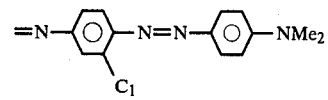

While the liquid crystal cell, so far as described above, may be viewed with back illumination, it is here shown as a reflective device and has, adjacent the back plate 5, a reflector 23 which may be a specular or diffusely reflecting metal film (eg silver, aluminum), or, a diffusely reflecting white paint, or card.

The electrode bearing plates 3, 5 extend beyond the spacer 19 to facilitate external connection to the electrode structures 7, 9.

Figure 2:
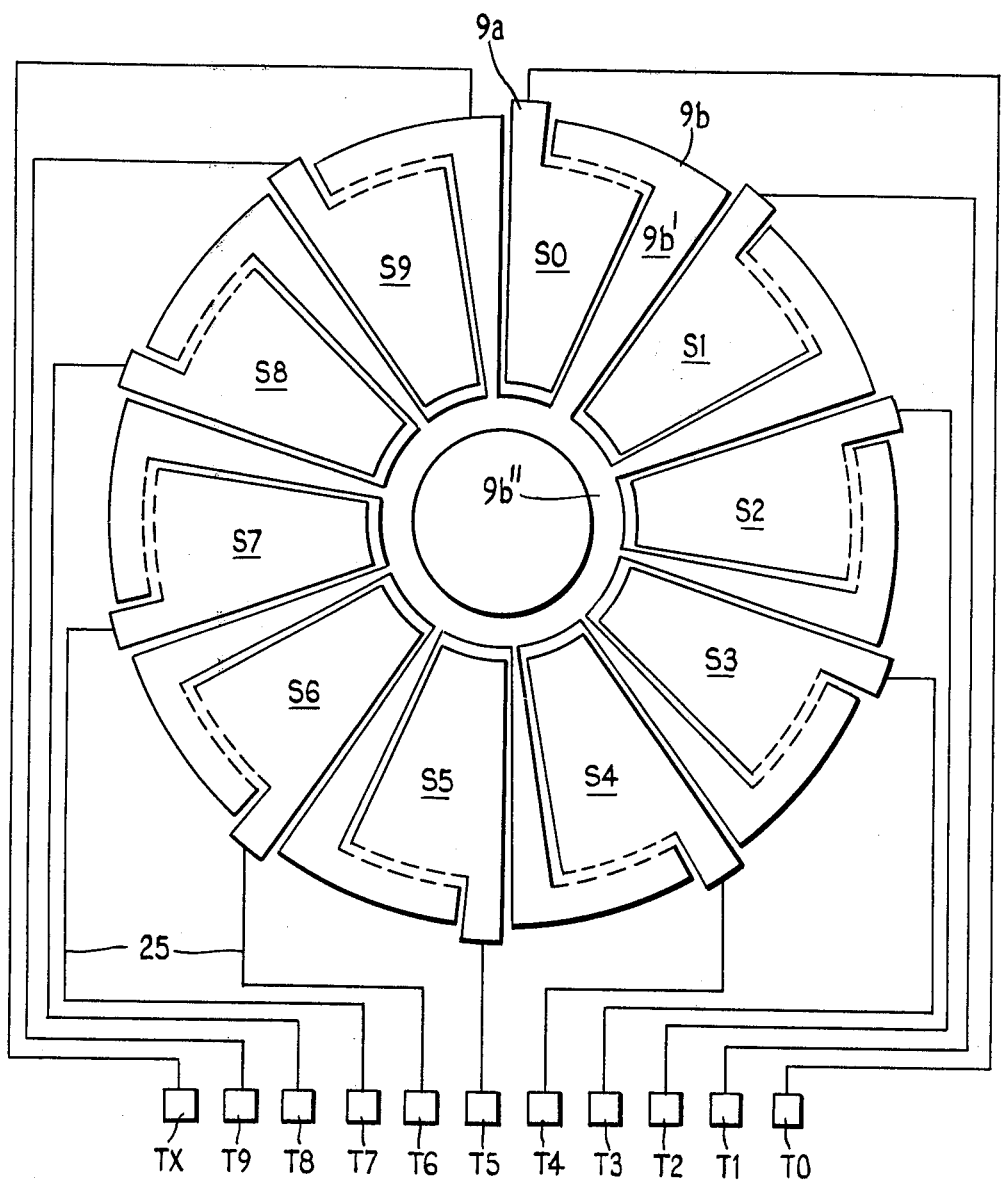
FIG. 2 is an outline illustration of the back-plate electrodes of this display panel.
Figure 3:
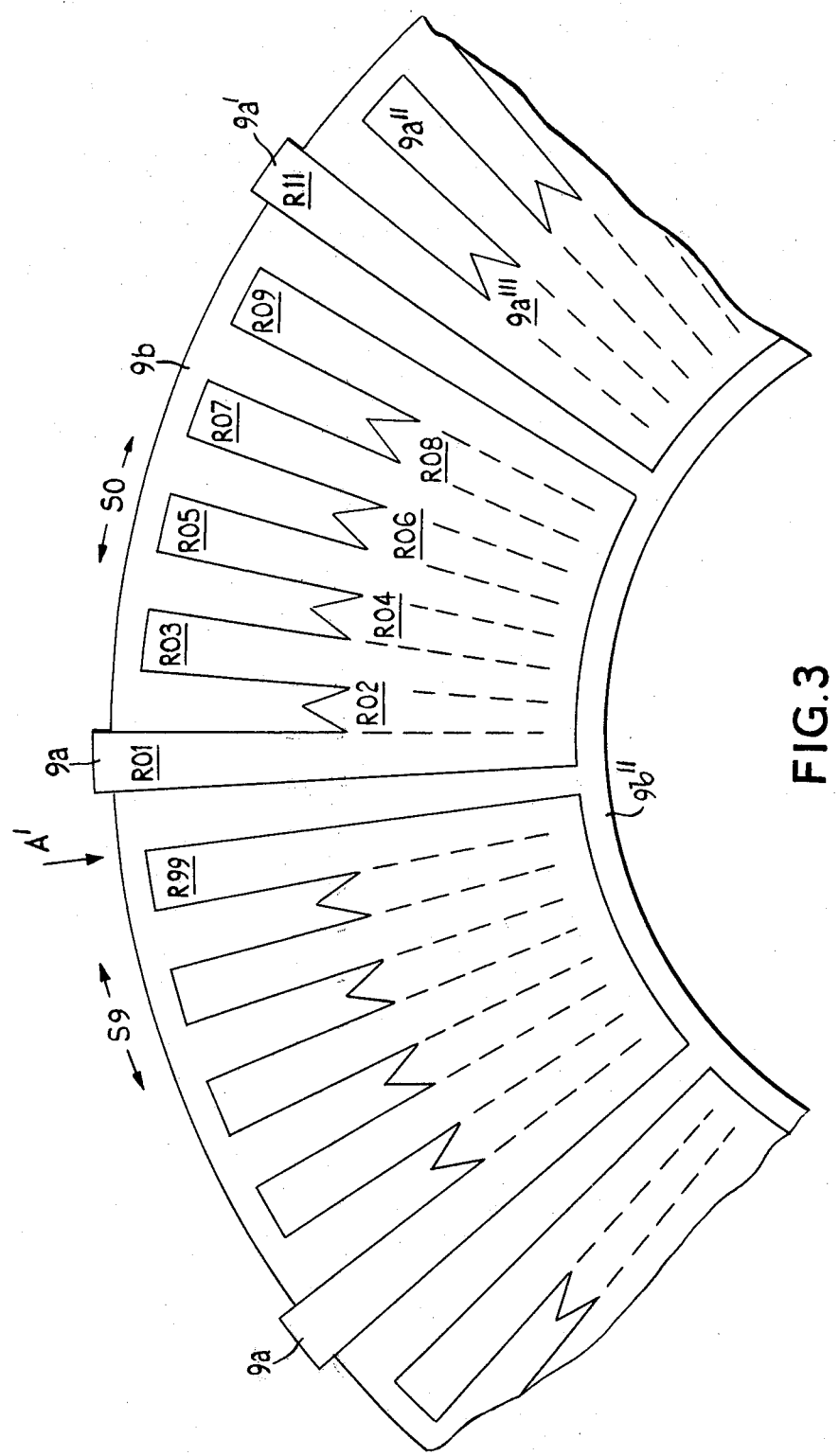
FIG. 3 is a detailed plan showing a portion of the backplate electrodes shown in outline in FIG. 2.

Particular configurations of the electrode structures 7, 9 are now described with reference to FIGS. 2, 3 and 4. These configurations are suited to displays operated to perform as meters requiring the simultaneous display of two index characters.

The back electrode structure comprises ten segment portions S0, S1, ... S9 arranged to form a circular array. Each one of the segments S0, ... S9 has component parts 9a, 9b of which the parts 9a are each in the form of a shaped segment, and the part 9b is in the form of a peripheral background electrode adjacent and nearly surrounding the parts 9a. The electrode 9b, as shown, has a number of thin outwardly extending limbs 9b', which limbs extend between the parts 9a and are isolated from them by narrow spacing. The limbs 9b' are integrally connected, to form the single background electrode 9b, by a central ring conductor 9b''. Consequently, the whole of the display area provided by segments S0, ... S9 is almost completely spanned by the material of the electrodes 9a, 9b with the exception of a minimum of space necessary for electrode isolation. The sectors 9a of the segments S0, ... S9 are connected to pad terminals T0, ... T9 respectively; and the background electrode 9b is connected to a single terminal TX by connecting strips 25 (shown schematically). Since the limbs 9a' of the background electrode 9b are connected centrally, the connections to the terminal may be made without bridging the connecting strips 25 on the back plate 5. It is noted that in the absence of central connection, 9b'' the number of terminals TX would be unduly multiplied to avoid bridging.

To afford display of two index characters made distinct by different shape, the segment electrodes are shaped to provide long hand and short hand index regions. Each segment electrode 9a, as shown, has extended limbs 9a', 9a'' and foreshortened limbs 9a'''. The extended limb 9a' of each sector 9a is lengthened to facilitate connection to the terminals T0, ... T9. When registered with the meander electrodes of the front electrode structure 7, the shaped electrode 9a of the first segment S0 provides five long hand index regions R01, R03, ... R09 and four short hand index regions R02, R04, R08 as determined by electrode overlap. (These regions are delineated in FIG. 3, to show this overlap, by broken outline). Similarly in the adjacent segments, Si (i=1 to 9), long hand index regions Ri1, Ri3, ... Ri9, and short hand index regions Ri2, Ri4, .. . Ri8 are determined by corresponding electrode overlap.

The front electrode structure 7 comprises a set of electrodes including a first sub-set of five strip electrodes E1, E3, ... E9. These electrodes, are shaped and arranged in a modified meander configuration and are registered A' upon A' to delineate the long hand index regions, eg the strip electrode E1 overlaps the segments S0, S1, . . . S9 delineating the index regions R01, R19, . . . R99. Similarly electrode E9 delineates the index regions R09, R11, R91. Alternating with electrodes E1, E3, . . . E9 is a second sub-set of five strips electrodes E0, E2, . . . E8. These electrodes overlap the short hand index regions and also the limbs 9b' of the peripheral electrode 9b. Thus the strip electrode E2 overlaps the segments S0, S1, . . . S9 and delineates the index regions R02, R18, . . . R98. The strip electrode E8 similarly delineates the index regions R08, R12, . . . R92. The electrode E0 however overlaps the limbs 9b'.

Figure 5A:
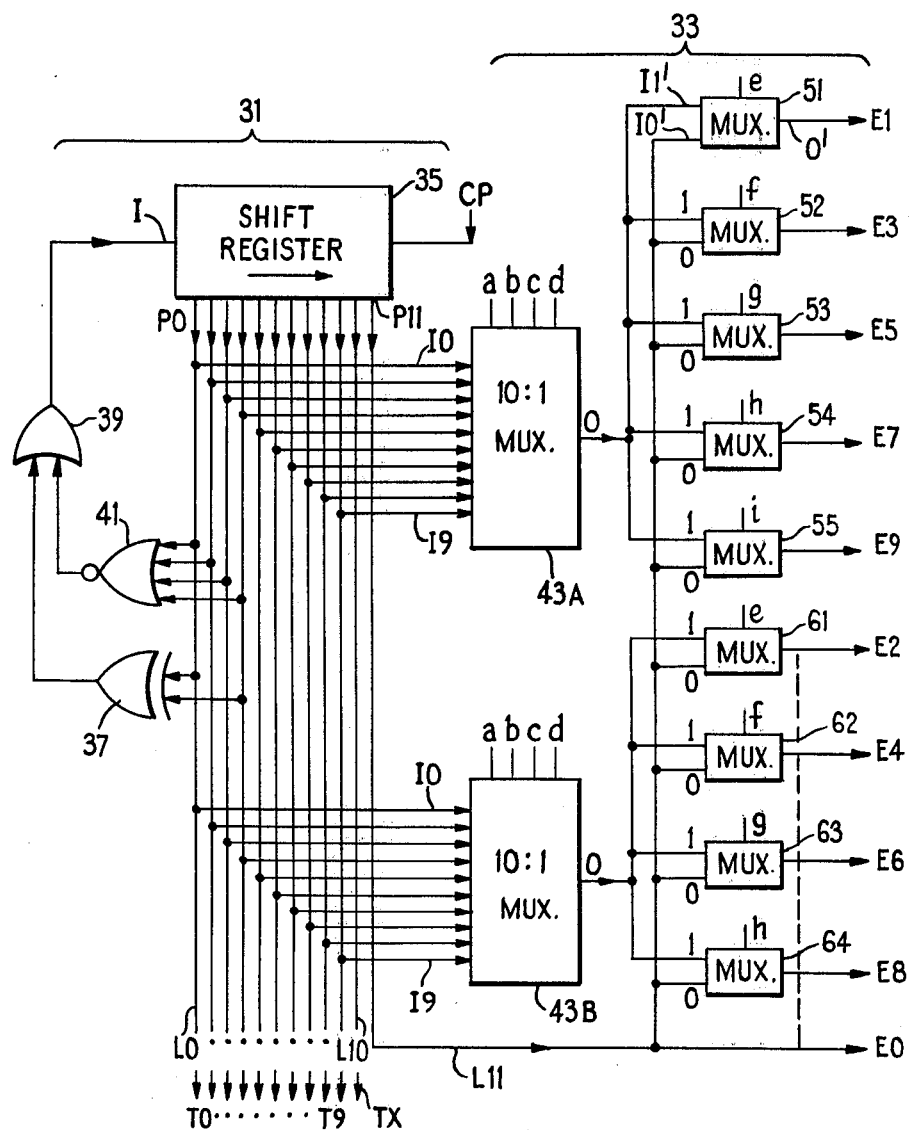
FIGS. 5a and 5b are circuit layout diagrams illustrating the arrangement of electronic components for operation of a display panel constructed as described below with reference to FIGS. 1 to 4.
Figure 5B:
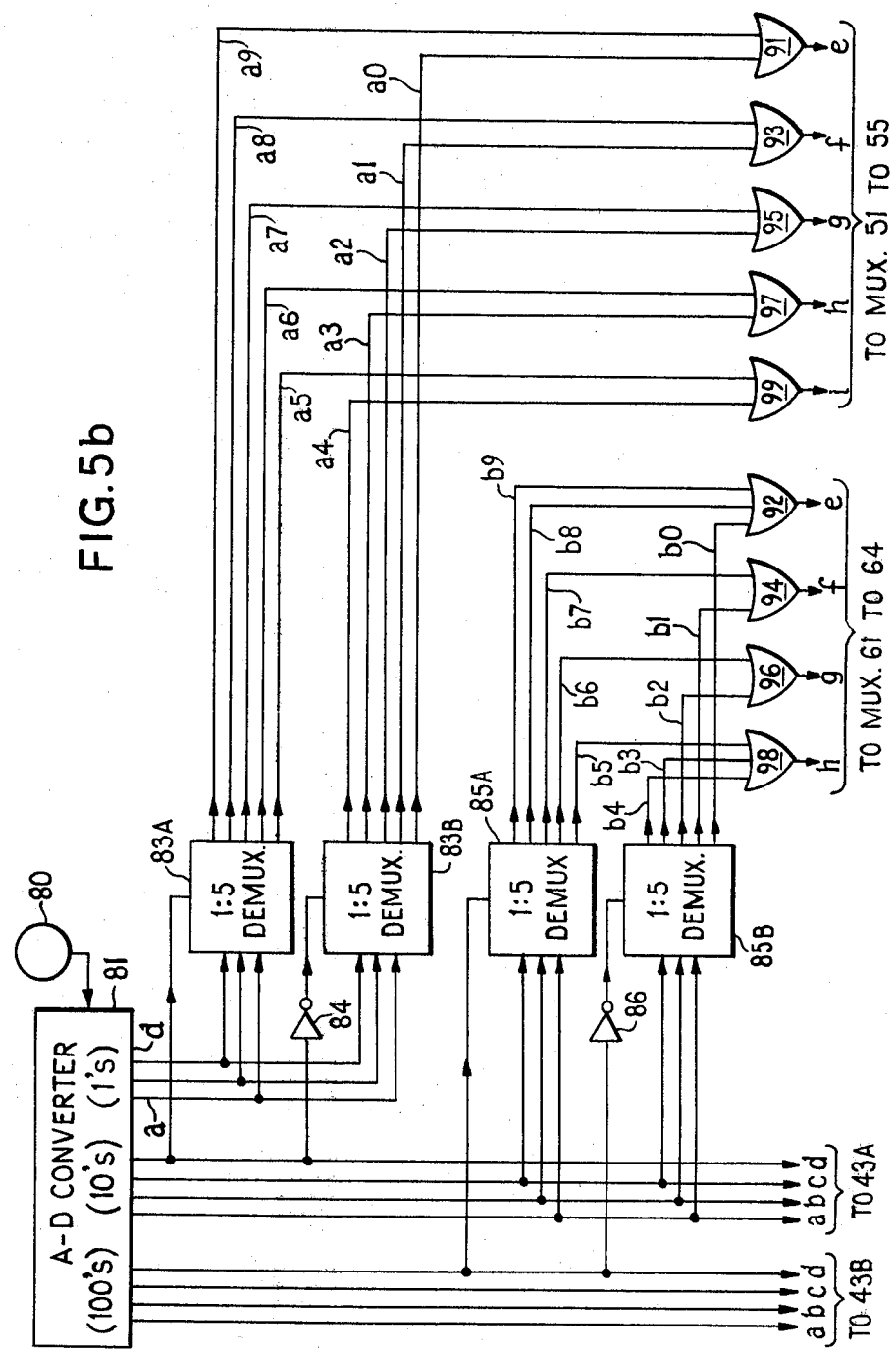

Circuitry, suitable for operating the display panel 1 having the electrode configurations described, is shown in FIGS. 5a, 5b.

There is shown in FIG. 5a a signal generator 31 and a signal selector 33. The signal generator 31 comprises a 12-bit serial-in/parallel out shift register 35 cooperative with logic feedback components 37, 39 and 41. The shift register 35 has twelve output ports P0, . . . P11 which feed twelve signal lines L0, . . . L11. In operation the voltage signals on these lines change from logic '1' to logic '0' ie Hi and Lo voltage levels, respectively, (according to the logic states of the corresponding register bits), as the shift register 35 is driven by the clocking pulses of an oscillator clock CP. The frequency of these is ideally ≧400 Hz to avoid flicker. The voltage signals are differently phased, as ensured by the shift register. Consequently, the first and fourth signal lines L0 and L3 control the input port I of the register 35 through logic feedback components 37, 39, an exclusive OR gate, and and OR gate, respectively. At the start of signal generation, however, the output signals are all maintained in the Lo voltage state, so to enable code generation to begin, feedback is provided from the first four signal lines L0, . . . , L3 through logic feedback component 41, a 4-input NOR gate, and the OR gate 39. This ensures that on initiation the input I is held Hi and changes the logic state of the first bit of register 35, corresponding to output port P0, line L0, from the logic '0' to the logic '1' state on the first clock edge. After a short initiation interval corresponding to the input of a small number of clocking pulses, the feedback through components 37, 39 ensures that pseudo-random binary sequence voltage signals are output onto the signal lines L0, . . . L11. Thus as the register 35 is clocked, this feedback ensures that the first four bits are changed from one set of logic states to another in a recurrent but pseudo-random sequence as shown in table 1 below:

TABLE 1

|  |  | Clock Pulse Number in Sequence | | | | | | | | | | | | | | | |
| --- | --- | --- | --- | --- | --- | --- | --- | --- | --- | --- | --- | --- | --- | --- | --- | --- | --- |
|  |  | 1 | 2 | 3 | 4 | 5 | 6 | 7 | 8 | 9 | 10 | 11 | 12 | 13 | 14 | 15 | 16 |
| Logic state | P0 | 1 | 1 | 1 | 1 | 0 | 1 | 0 | 1 | 1 | 0 | 0 | 1 | 0 | 0 | 0 | 1 |
| of bits cor- | P1 | 0 | 1 | 1 | 1 | 1 | 0 | L | 0 | 1 | 1 | 0 | 0 | 1 | 0 | 0 | 0 |
| responding | P2 | 0 | 0 | 1 | 1 | 1 | 1 | 0 | 1 | 0 | 1 | 1 | 0 | 0 | 1 | 0 | 0 |
| output ports P0 to P3 | P3 | 0 | 0 | 0 | 1 | 1 | 1 | 1 | 0 | 1 | 0 | 1 | 1 | 0 | 0 | 1 | 0 |

The pseudo random sequence output signals from ports P0 to P11, provided after the initiation interval, are shown in table 2 below:

TABLE 2

|  |  | The Coded signal sequence developed in time | | | | | | | | | | | | | | | |
| --- | --- | --- | --- | --- | --- | --- | --- | --- | --- | --- | --- | --- | --- | --- | --- | --- | --- |
| Output signals | P0 | 1 | 0 | 0 | 1 | 0 | 0 | 0 | 1 | 1 | 1 | 1 | 0 | 1 | 0 | 1 | 1 |
| corresponding | P1 | 1 | 1 | 0 | 0 | 1 | 0 | 0 | 0 | 1 | 1 | 1 | 1 | 0 | 1 | 0 | 1 |
| to ports | P2 | 0 | 1 | 1 | 0 | 0 | 1 | 0 | 0 | 0 | 1 | 1 | 1 | 1 | 0 | 1 | 0 |
| P0 to P11 | P3 | 1 | 0 | 1 | 1 | 0 | 0 | 1 | 0 | 0 | 0 | 1 | 1 | 1 | 1 | 0 | 1 |
|  | P4 | 0 | 1 | 0 | 1 | 1 | 0 | 0 | 1 | 0 | 0 | 0 | 1 | 1 | 1 | 1 | 0 |
|  | P5 | 1 | 0 | 1 | 0 | 1 | 1 | 0 | 0 | 1 | 0 | 0 | 0 | 1 | 1 | 1 | 1 |
|  | P6 | 1 | 1 | 0 | 1 | 0 | 1 | 1 | 0 | 0 | 1 | 0 | 0 | 0 | 1 | 1 | 1 |
|  | P7 | 1 | 1 | 1 | 0 | 1 | 0 | 1 | 1 | 0 | 0 | 1 | 0 | 0 | 0 | 1 | 1 |
|  | P8 | 1 | 1 | 1 | 1 | 0 | 1 | 0 | 1 | 1 | 0 | 0 | 1 | 0 | 0 | 0 | 1 |
|  | P9 | 0 | 1 | 1 | 1 | 1 | 0 | 1 | 0 | 1 | 1 | 0 | 0 | 1 | 0 | 0 | 0 |
|  | P10 | 0 | 0 | 1 | 1 | 1 | 1 | 0 | 1 | 0 | 1 | 1 | 0 | 0 | 1 | 0 | 0 |
|  | P11 | 0 | 0 | 0 | 1 | 1 | 1 | 1 | 0 | 1 | 0 | 1 | 1 | 0 | 0 | 1 | 0 |

The difference between any two signals is nett AC and has an RMS value of $(8/15)^{\frac{1}{2}}$. V, where V is the voltage difference between the Lo logic '0' and Hi logic '1' levels. It is preferable that all finite RMS voltage differences developed across the panel are greater than 1.1 times the saturation voltage characteristic of the liquid crystal material 11.

If the logic voltage levels provide RMS differences compatible with the drive requirements of the display panel, the signals on signal lines L0, . . . , L10 may be applied directly to the input terminals T0 to T9 and TX of the back plate electrode structure 9. However, if the RMS differences were not compatible, the signals on lines L0, L10 could be applied to terminals T0 to T9 and TX via matching amplifiers.

The signal selector 33 comprises two 10:1 multiplexers 43A, 43B, a first set of five 2:1 multiplexers 51, . . . , 55 and, a second set of four 2:1 multiplexers 61, . . . , 64. Each of the 10:1 multiplexers 43A, 43B has ten signal inputs I0, . . . , I9 one connected to each of the signal lines L0, . . . , L9. Each 10:1 multiplexer 43A, 43B has four primary control inputs a to d and has a single output port 0. For each binary address 0 to 9 applied to the control inputs a to d, inputs I0 to I9 are connected respectively to the output port 0. The 10:1 multiplexer 43A and the first set of 2:1 multiplexers 51 to 55 are dedicated to the display of one of the two characters (ie the long hand) and similarly the 10:1 multiplexers 43B and the second set of 2:1 multiplexers 61 to 64 are dedicated to the display of the other distinctive index character (ie the short hand).

Each of the 10:1 multiplexers 43A, 43B is responsive to primary data signals which may be applied to their control inputs a to d. Each has the function of selecting, according to the primary data signal coding, one of the ten signals applied on lines L0 to L9 and channeling each selected signal to each output port 0.

Each 2:1 multiplexer 51 to 55, 61 to 64 has a first and second signal input port I0', I1' and an output port 0'. The 2:1 multiplexers 51 to 55 have each a secondary control input e to i, and the 2:1 multiplexers 61 to 64, secondary control inputs e to h. If the secondary control input is at logic "1" then the output port 0' is connected to I1', and if at logic "0" then the output port is connected to I0'. The output ports 0' of the 2:1 multiplexers 51 to 55 are connected either directly, or, if necessary, via matching amplifiers, to the front-plate electrodes
E1, E3, . . . , E9, while those of the 2:1 multiplexers 61 to 64 are connected in like manner to electrodes E2, E4, E6 and E8, respectively. The first signal input ports I1' of 2:1 multiplexers 51 to 55 are connected in parallel to the output port 0 of the 10:1 multiplexer 43A, and in like manner the first signal input ports E1' of 2:1 multiplexers 61 to 64 are connected to the output port 0 of the 10:1 multiplexer 43B.

The first set of 2:1 multiplexers 51 to 55 are responsive to secondary control signals which may be supplied to their control inputs e to i. Collectively these 2:1 multiplexers have the function of channeling the selected signal from the output port 0 of the 10:1 multiplexer 43A onto a selected one of the front plate electrodes E1, E3 to E9 according to the secondary control signal coding. In this way, therefore, an applied signal may be selected and channeled to a selected one of the meander electrodes E1, E3 to E9 so that across the region of the medium 11 of the display panel 1 delineated by the intersection of the selected meander electrode and the segment electrode to which this selected signal is also applied, a zero RMS difference voltage is developed since like signals are applied to the selected meander electrode and the appropriate segment electrode. The medium 11 in this delineated region is thus held in the OFF state for the duration of these like signals.

The second set of 2:1 multiplexers 61 to 64 function in similar manner to channel the selected signal from the output port 0 of the 10:1 multiplexer 43B onto a selected one of the second subset of front plate electrodes E2, E4, E6 and E8 to produce the OFF state in another region of the medium 11.

The second signal inputs I0' of the 2:1 multiplexers 51 to 55, and 61 to 64 are connected in parallel to signal line L11. These multiplexers ensure that the signal on this line is channeled directly, or where appropriate through amplifiers, to the remaining-and-non-selected meander electrodes E1 to E9. The meander electrode E0 is connected directly, or through a matching amplifier, to line L11. The voltage signal on line L11 is different from all signals applied to the terminals T0 to T9 and TX and consequently across all other regions of the medium 11 delineated by the overlap of the front and back-plate electrode structures 7, 9, a finite RMS voltage difference is developed and these regions, which provide the display background, are held in the ON state for the duration of these different signals. Consequently, the two distinctive index characters are displayed simultaneously against an optically contrasting background.

There are shown in FIG. 5b the component parts of a control data source for providing the primary and secondary control data signals to operate the signal selector 33. This source comprises: an input transducer 80; an A-D converter 81 including timing circuits and sampling means (not shown) where necessary; two pairs of 1:5 demultiplexers pair 83A and 83B, and pair 85A and 85B each with an associated inverting amplifier 84, 86 respectively; and nine OR gates 91 to 99, two of these 92, 98 being 3-input OR gates.

The input transducer 80 provides an analogue signal as an electrical measure of some scalar function (eg pressure) and this signal is coded by A-D converter 81 to produce logic signals in a binary-coded-decimal (BCD) form at three sets of four outputs a to d corresponding the binary coded units (1's), tens (10's) and hundreds (100's) of the digitized analogue values, a being the most significant, and d the least significant bit outputs.

The outputs a to d corresponding to the tens and hundreds provide the primary control data signals for the 10:1 multiplexers 43A, 43B respectively.

The first pair of 1:5 multiplexers 83A, 83B is controlled by the three most significant bit outputs of the units section of the converter 81. The least significant bits output d of the next adjacent section, the tens section, provides a logic signal '0' or '1' at the input port of 1:5 demultiplexer 83A to which it is connected directly, and an inverted logic signal '1' or '0' at the input port of 1:5 demultiplexer 83B to which it is connected via inverting amplifier 84. This pair of 1:5 multiplexers 83A, 83B provides the secondary control data signals that control the first set of 2:1 multiplexers 51 to 55. Since one or other of the input logic signals is a logic '1', a logic '1' signal is fed onto one of the five output channels a0 to a4 of the demultiplexer 83B or one of the five output channels a5 to a9 of the demultiplexer 83A, all of the other outputs being simultaneously at logic '0'. All the output channels are connected to the inputs of the OR gates 91, 93, . . . , 99, which in turn have outputs connected to the control inputs e to i of the first set of 2:1 multiplexers 51 to 55. The output channels a0 to a9 are connected to the OR gates, 91, 93, . . . , 99 in the order: a4, a5 to 99; a3, a6 to 97; a2, a7 to 95; a1, a8 to 93; and a0, a9 to 91. The pairing of the multiplexers, and the use of the OR gates, compensates for the reversing characteristic of the meander structure, enabling the index positions R01, R03 to R99 to be selected consecutively with increasing values of the analogue signal.

The 1:5 multiplexers 85A, 85B are both controlled by the three most significant bit outputs of the tens section of the converter 81. The least significant bit output d of the hundreds section provides logic signals '1' or '0' to demultiplexers 85A, 85B in manner similar to that above and a logic '1' is fed onto one of the control inputs e to h of the second set of multiplexers 61 to 64 after being channelled onto one of the ten output channels b0 to b9 of demultiplexers 85B, 85A and through one of the OR gates 92, 94, 96 or 98. These output channels b0 to b9 are connected to the OR gates 92, 94, 96 and 98 in order: b3, b4 and b5 to 98; b2, b6 to 96; b1, b7 to 94 and b0, b8 and b9 to 92. The 3-input OR gates 92, 98 are connected in this manner so that it is possible to "mark time" once for every hundreds value, there being four rather than five short-hand character index positions for each segment.

The combination of this control data source with the signal selector 33, signal generator 31 and display panel 1 provides a meter display whereby values between 0 and 998 may be represented by a short-hand index character indicating the hundreds value, and the long-hand index character indicating the tens and units value of the measured scalar function.

The operation of this meter display may be illustrated by considering the response of the display to a slowly increasing scalar function, the BCD data running in unit increments from zero. Thus, initially, the three sets of four bit outputs a to d of the converter 81 are in the 0000 condition. In response to this, the outputs of inverting amplifiers 94, 86 are set at logic level '1' and in response the outputs on channels a0, b0 of the demultiplexers 83B, 85B are held at logic level '1'. All other demultiplexer outputs a1 to a9, and b1 to b9 are set at logic level '0'. A logic level '1' is thus applied via gates 91, and 92 to the controlling inputs e of the 2:1 multiplexers 51, 61 and front-plate electrodes E1, E2 are thereby selected for application of the particular drive signals selected by the two 10:1 multiplexers 43A, 43B. Both these 10:1 multiplexers 43A, 43B receive 0000 primary control data addresses from the tens and units BCD outputs a to d of converter 91. Thus in both cases, the voltage signal on the first line L0 from shift register 35, which is applied via terminal T0 to segment S0, is also channeled to the frontplate electrodes E1, E2. Thus at the regions of overlap of these electrodes E1, E2 with segment S0, ie at the index regions R01, R02, the medium 11 is held in the OFF state, there being zero RMS voltage difference applied across the panel 1 since like signals are applied to these particular overlapping electrodes. Thus in the case of the cholesteric-nematic phase change liquid crystal cell with pleochroic dye, the liquid crystal material is maintained in the cholesteric phase (OFF state) and absorbs incident light. Since finite RMS voltage differences are applied across all other index regions R03 to R99, the medium 11 is held in the ON state and in the case of the liquid crystal cell above, the liquid crystal material is switched to, and maintained in, the nematic phase (ON state) where the dye absorption is greatly reduced, incident light being reflected from the reflector in these regions. A long-hand index character is displayed to indicate the 00 on the scale 15 with the short hand index character displayed in the immediately adjacent index position, both in optical contrast against the background of the display.

Upon the first increment of the BCD data, the units data changes from 0000 to 0001, the tens and hundreds data remaining unchanged. This change however produces no response since the first pair of demultiplexers 83A, 83B only responds to changes in the three most significant bits of the units data. But on the next BCD data increment, where the units data changes to 0010, the logic '1' level signal is switched by demultiplexer 83B from channel a0 to channel a1 and in consequence, the signal on line L0 is switched from electrode E1 to electrode E3 and the position of the displayed long-hand index character is changed from region R01 to R03 to indicate 02 on the graduated scale 15.

As the BCD data is further incremented through units data states 0100, 0110, 1000 the position of the displayed long-hand index character changes progressively in a clockwise direction around the scale to indicate 04, 06, 08 on the graduated scale 15 as the signal on line L0 is switched by the first set of 2:1 demultiplexers 51 to 55 to front-plate electrodes E5, E7, E9. On the next increment, the units data changes to 1001 without causing further change. On the next increment, however, the units data state is reset to 0000 and the tens data state changes from 0000 to 0001. Control, in consequence, shifts to demultiplexer 83A and a logic level '1' signal is switched to channel a5 and via OR gate 99 to the secondary control input i of demultiplexer 55. The particular voltage signal selected by multiplexer 43A is thus applied to back-plate electrode E9. The primary control data address of this multiplexer 43A has been changed from 0000 to 0001 and, therefore, it is the signal on line L1, applied to terminal T1 and segment S1, that is selected. The long-hand index character thus changes to the position of region R11 delineated by the overlap of the back-plate electrode E9 and the front plate electrode segment S1. On subsequent increments, as the units data state changes from 0000 to 0010, 0100, 0110 and 1000, the signal on line L1 is channeled to electrodes E7, E5, E3, E1, ie the electrodes taken in reverse order, and the long-hand index character changes position from region R11 to regions R13, R15, R17, R19 to indicate values 12, 14, 16, 18 respectively on the graduated scale 15.

After two more BCD data increments, the units data state is reset to 0000 and the tens data state changes from 0001 to 0010. These changes have three effects. Firstly, to change control from demultiplexer 83A back to 83B again so that a logic '1' level signal is applied to control the secondary control input e of multiplexer 51 to select back-plate electrode E1. Secondly, to change the signal selected by multiplexer 43A, to the signal on line L2, so that the long-hand index character moves from the position of region R19 to the position of region R21 to indicate a value 20 on the graduated scale 15. Thirdly, to change the state of demultiplexer 85B so that the signal selected by multiplexer 43B ie the signal on line L0, is switched from front plate electrode E2 to front plate electrode E4. The position of the short-hand index character thus changes from the position of region R02 to the position of region R04. After a further twenty BCD data increments, the tens data state changes from 0010 to 0100 with a further movement of the short-hand index character to the position of region R06. Another twenty increments, and the shorthand moves to the position of region R08. But, after the next twenty increments, the position of the short-hand index character does not change since channels b3, b4 both control the same secondary control input h of multiplexer 64 through 3-input OR gate 98. The short hand index character thus "marks time" for yet a further twenty increments, until the hundreds data state changes from 0000 to 0001 and both the tens and units data states are reset to 0000. When this change takes place, however, the long-hand index character returns to the position of the region R01 having made a full revolution of the dial. The short-hand index character moves into the second segment S1 to the position of region R12.

The circuitry of FIG. 5a may be simplified quite readily to provide only tens and units meter indication, ie the analogue display may be simplified for display of a single index character. Since in this simplified form of the display, hundreds indication by the short-hand index character is not required, the 10:1 multiplexer 43B and its associated set of 2:1 multiplexers 61 to 64 may be ommitted. To maintain the short-hand index regions of the display in the ON state so to afford overall a contrasting background, the front-plate electrodes E2, E4, E6 and E8 with E0 are connected in parallel to line L11 of the shift register and as shown in broken outline in FIG. 5a.

Alternative configurations of the front- and back-plate electrode structures 7, 9 will now be described with reference to the FIGS. 6, 7 and 8. These configurations are suited to displays operated to perform as timepieces requiring the display of three index characters for indication of the seconds, minutes, and hours time functions.

Figure 6:
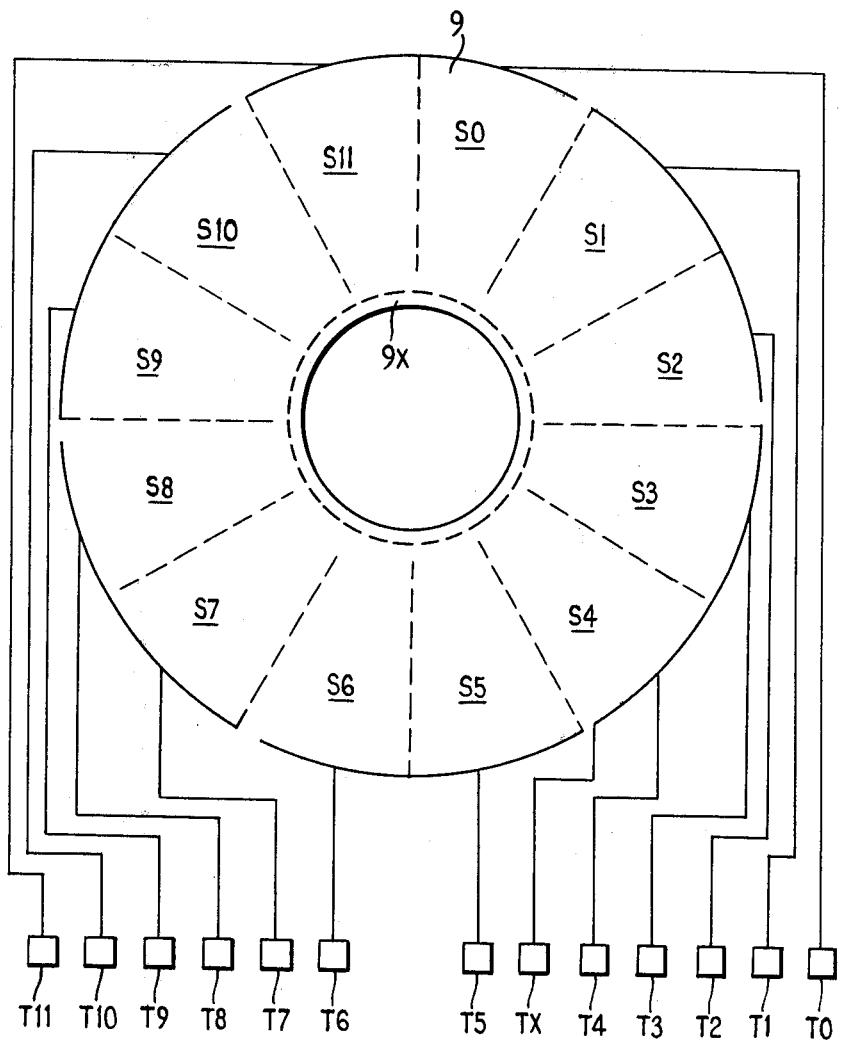
FIG. 6 is an outline illustration of an alternative arrangement of the back-plate electrodes of the display panel shown in FIG. 1.

The configuration of the back plate electrode structure 9 is shown in outline in FIG. 6. The structure is divided into twelve segment electrodes S0 to S11, and a common complimentary electrode 9x. Each segment electrode is of complex shape, as shown in FIG. 7, and in combination with the front plate structure 7 in FIG. 8, defines, at these regions of overlap, five seconds (s), five minutes (m), and five hours (h), index character regions having marker, long-hand and, short hand shapes, respectively. For the even segments S0, S2, ... S10 the segment electrode is shaped to define these regions in the order s m h s h m s m h s h m s m h; while for the odd segments S1, S3, ... S11, the segment electrode is shaped to define these regions in the reversed order s h m s m h s h m s m h s h m. It is noted that the seconds marker regions (s) are spaced evenly on an arcuate strip 9a while the minute and hour character regions (m) and (h), respectively, alternate about these seconds marker regions (s). This complex configuration allows access from the inside of the circle to the spaces X between inwardly extending portions of the segment electrode. The spaces X are filled in, but for a narrow isolating spacing from the inside perimeter of each segment electrode, with electrode material to form the common complimentary electrode 9X, the many portions of which are linked together by an inner circular ring. Each segment S0 to S11 is connected to a corresponding terminal pad T0 to T11. The common complimentary electrode 9X is connected to an auxiliary terminal pad TX.

Figure 8:
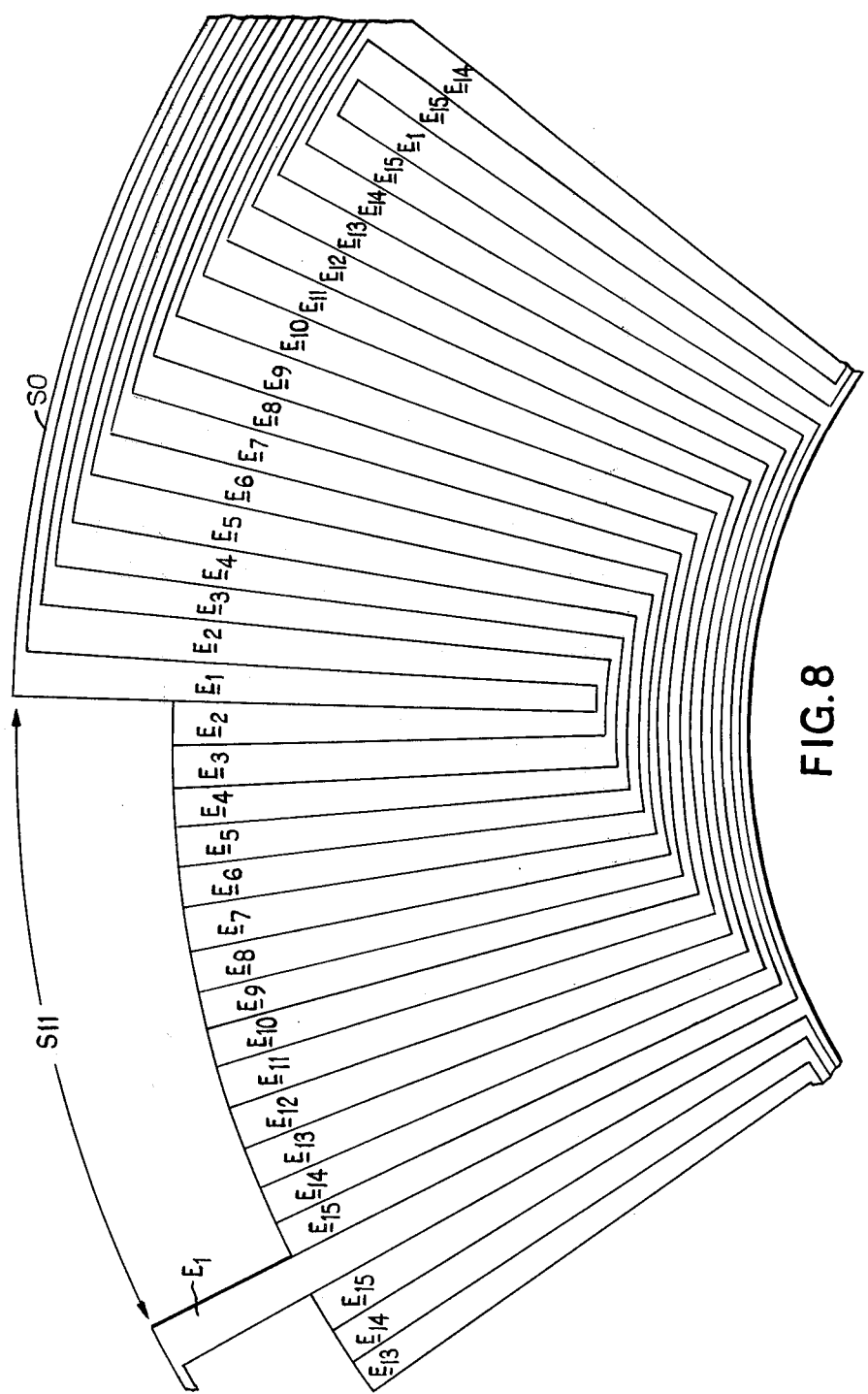
FIG. 8 is a detailed plan showing a portion of a set of front plate electrodes, the electrodes having a modified meander configuration suitable for overlapping the back-plate electrodes shown in detail in FIG. 7.

As shown in FIG. 8, the front plate electrode structure 7 comprises fifteen strip electrodes arranged in a modified meander configuration. These provide three subsets {E1, E4, E7, E10, E13}, {E2, E6, E8, E12, E14} and {E3, E5, E9, E11, E15} which, on assembly of the display panel 1, are arranged in register to overlap the shaped segment electrodes S0 to S11, to define the seconds, minutes, and hours index regions s, m, and h, respectively.

Figure 7:
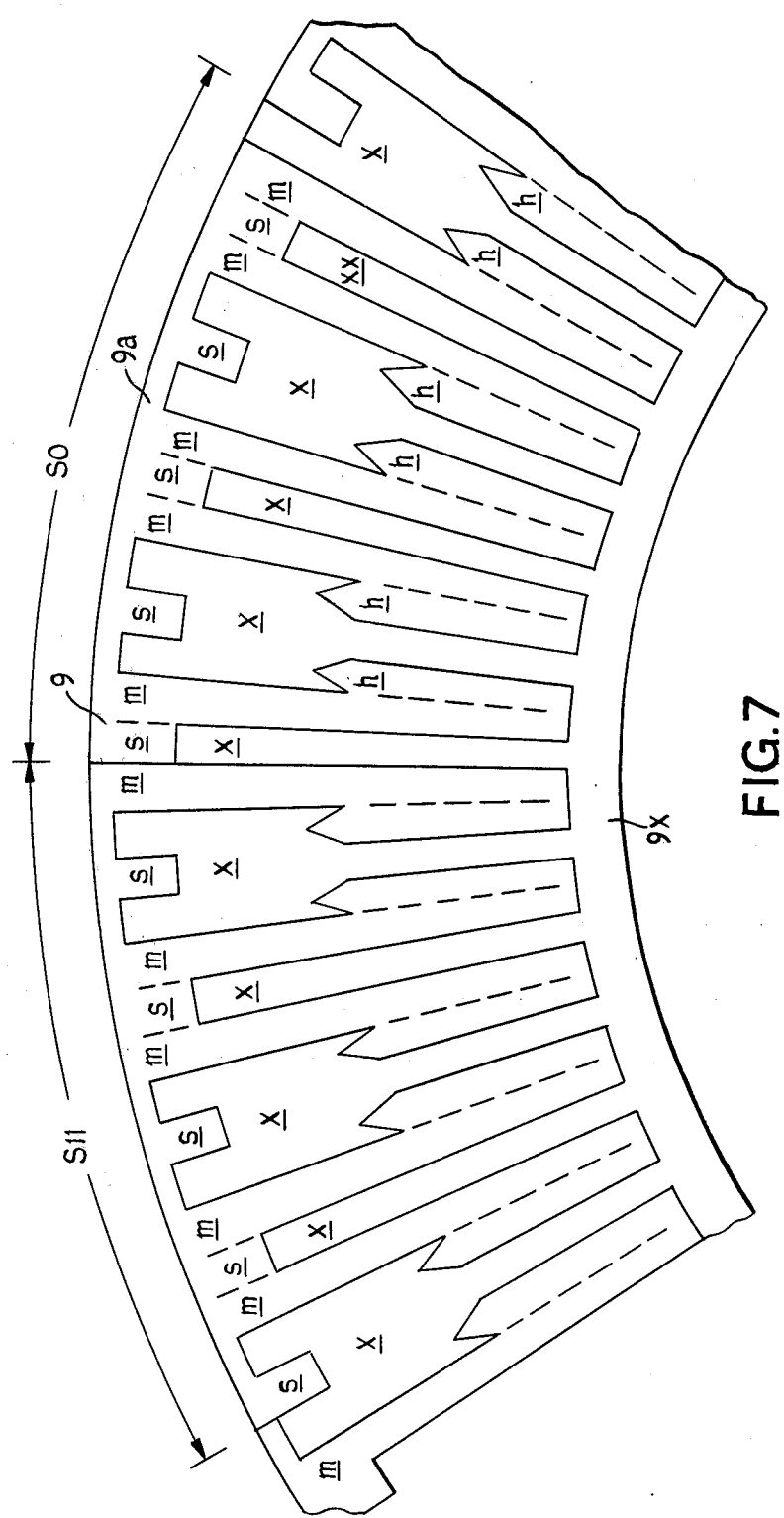
FIG. 7 is a detailed plan showing a portion of the backplate electrodes shown in outline in FIG. 6.

Circuitry for operating a display panel 1 having the electrode configurations shown in FIGS. 6, 7 and 8 and as above described, is shown in FIGS. 9a to d.

Figure 9A:
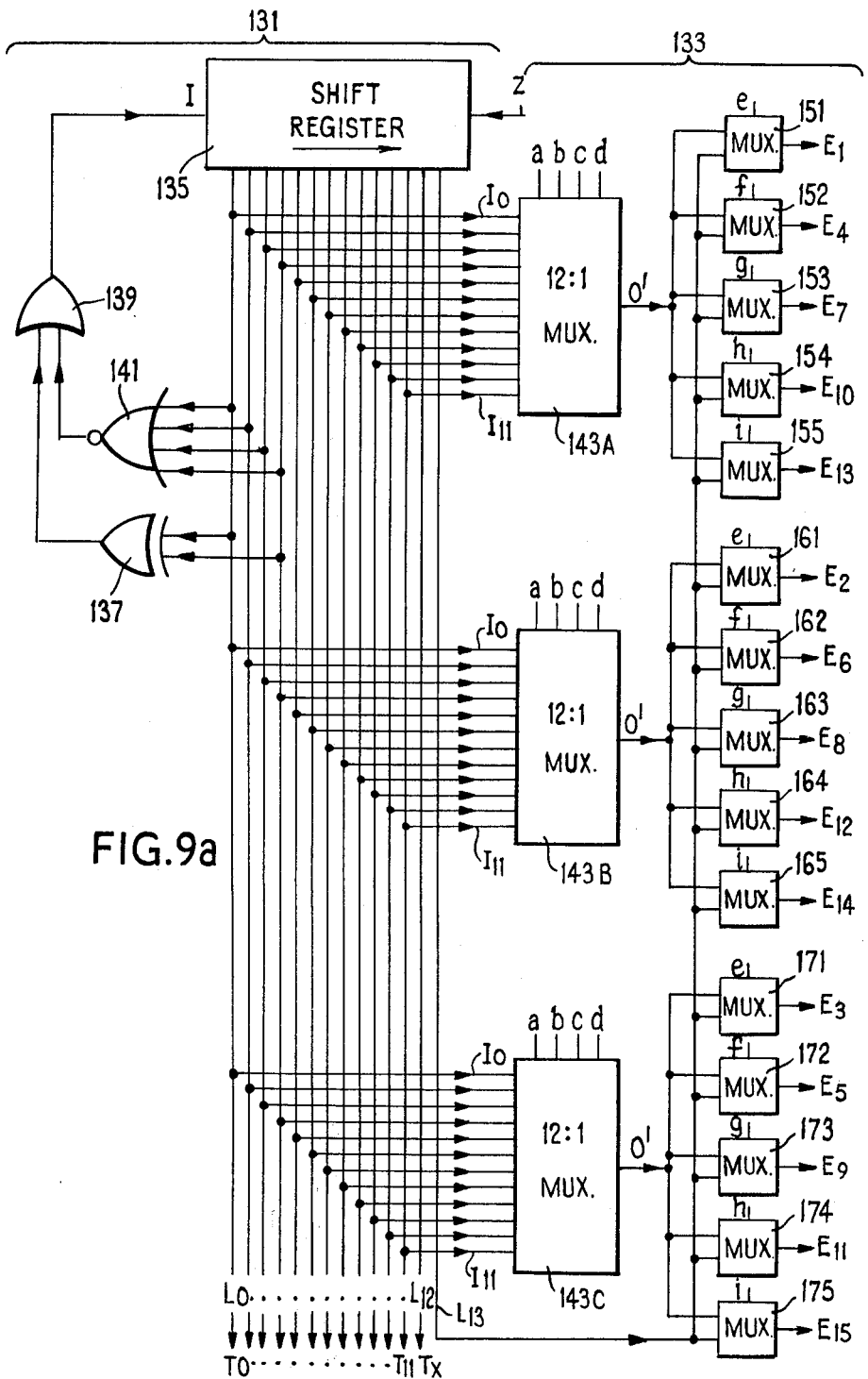

There is shown in FIG. 9a a signal generator 131 and a signal selector 133. The signal generator 131 comprises: a 14-bit serial in/parallel out shift register 135 having fourteen signal bit lines $L_0$ to $L_{13}$, one corresponding to each bit of the register; and, feed-back logic components, namely an exclusive OR gate 137, an OR gate 139 and a 4-input NOR gate 141. The logic components 137, 139, 141 are connected to the first four signal lines $L_0'$ to $L_3'$ of the register 135, as shown, and in a manner identical to that already described for the logic components 37, 39, 41 of FIG. 5a, and they perform identical feedback functions. The first twelve signal lines $L_0'$ to $L_{11}'$ are connected to the back-plate terminals $T_0'$ to $T_{11}'$, and the thirteenth signal line $L_{12}'$ is connected to the auxiliary terminal $T_X'$, of the back-plate electrode structure 9. The shift register is driven by clock-pulses derived indirectly from an oscillator clock at Z on FIG. 9b, the clock-pulse having a repetition frequency typically greater than 400 Hz to avoid flicker on the display.

The signal selector 133 comprises three 12:1 multiplexers 143A, 143B and 143C, and associated with each multiplexer 143A, 143B, 143C, a set of five 2:1 multiplexers, namely multiplexers first set {151 to 155}, second set {161 to 165} and third set {171 to 175}. Each 12:1 multiplexer 143A, 143B, 143C has four primary control signal input ports a to d, and an output channel 0'. Under the control of primary control signals, each 12:1 multiplexer 143A, 143B and 143C selects a voltage signal from one of the signal lines $L_0$ to $L_{11}$ and channels this signal, in each case, onto its output channel 0' and to one of the two input ports of every one of the five 2:1 multiplexers, with which it is associated. Each one of the 2:1 multiplexers 151 to 155, 161 to 165, and 171 to 175 has a secondary control input port, namely input ports e, to i, respectively. The first set of 2:1 multiplexers {151 to 151} are connected, either directly, or indirectly via matching amplifiers, to the first subset of front-plate electrodes {E1, E4, E7, E10, E13} so that the appropriate signal selected by 12:1 multiplexer 143A may be channeled to one of these electrodes, under secondary control, for positioning the seconds index character. Similarly, the second and third set of 2:1 multiplexers {161 to 165} and {171 to 175} are connected to the second and third subsets of front plate electrodes, namely subsets {E2, E6, E8, E12, E14} and {E3, E5, E9, E11, E15} for positioning the minutes and hours index characters, respectively.

Figure 9B:
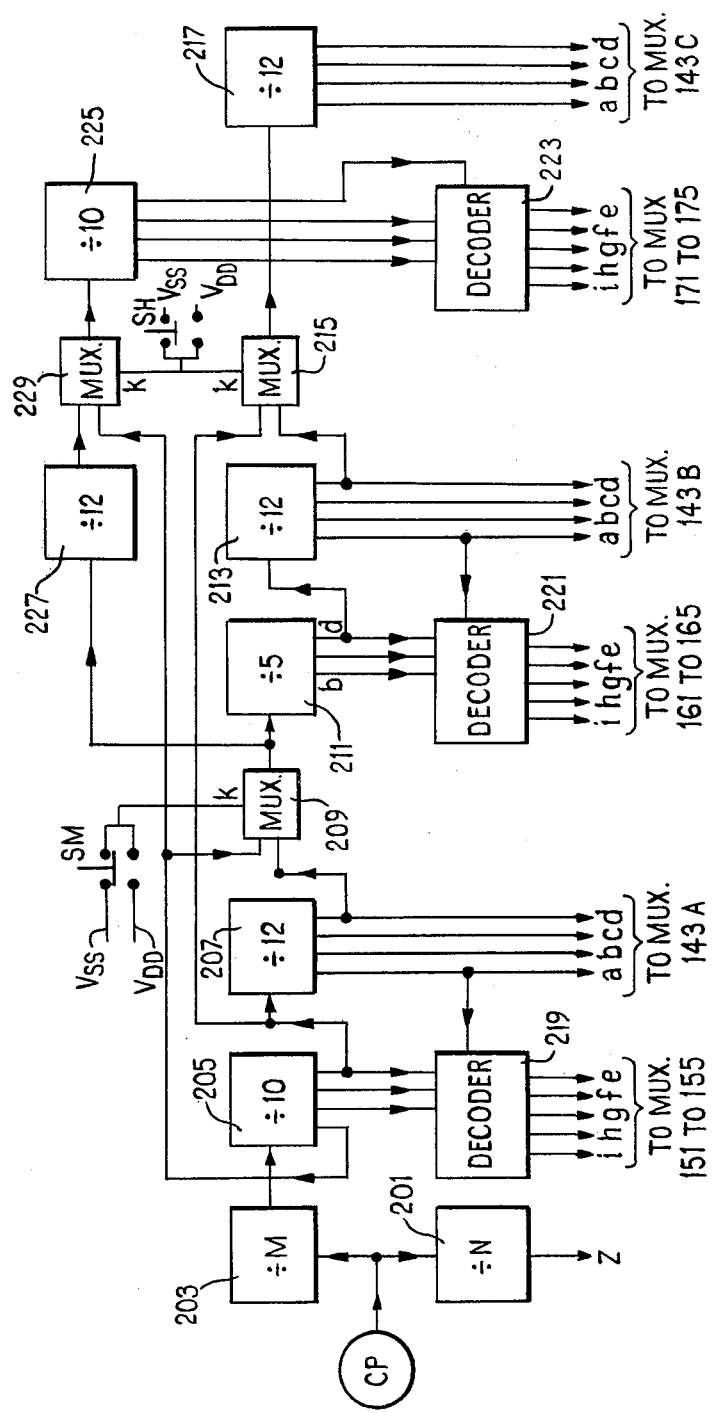

The clock pulses, the primary and the secondary control signals, required to operate the circuitry described above are provided by other circuitry which is now described with reference to FIGS. 9b to d. This other circuitry comprises: an oscillator clock CP; a scaling divider 201 for scaling down the frequency of the clock pulses provided by this clock CP by a factor N so as to provide, on an output line Z, clock pulses suitable for driving the shift register 135 (ie clock pulses having a frequency greater than or of the order of about 400 Hz); and a divider chain adapted to provide the primary and secondary control signals. This divider chain includes a scaling divider 203 responsive to the oscillator clock CP for dividing down the frequency of the clock pulses by a scale factor M to provide after division, a signal having a pulse repetition frequency of precisely 2 Hz. This divider 203 is followed by a +10 counter 205 and thereafter by a first +12 counter 207. This first +12 counter 207 has four counter outputs a to d which provide the primary control signals for multiplexer 143A. This counter 207 also provides, at its most significant bit output d, a first logic reference waveform of period one minute. During normal timing operation, this first logic reference is channeled through a first 2:1 multiplexer 209 to the input port of a +5 counter 211, and this latter is followed by a second +12 counter 213. The second +12 counter 213 has four counter outputs a to d which provide the primary control signals for multiplexer 143B. This counter 213 also provides at output d, a second logic reference of period one hour. This second reference is channeled through a second 2:1 multiplexer 215 to a third +12 counter 217. The third +12 counter 217 has four counter outputs a to d which provide the primary control signals for multiplexer 143C.

Secondary control signals for the 2:1 multiplexers 151 to 155, 161 to 165, and 171 to 175 are provided at output ports e to i of three decoders 219, 221 and 223. The 1:5 demultiplexers used in these have all their outputs except the selected one at logic '0' level. The first of these decoders 219 is connected to receive signal codes from the three most significant bit output ports b, c, and d of the +10 counters 205, and the least significant bit output port a of the first 12 counter 207. Similarly, the second of these decoders 221 is connected to receive signal codes from the three most significant bit output ports b, c and d of the +5 counter 211, and the least significant bit output port a of the second +12 counter 213. However, the third of these decoders 223 is connected to the four output ports a to d of a second +10 counter 225. A +12 divider 227 is connected to the output port of the first 211 multiplexer 209 to receive, under normal conditions, the first logic reference and to reduce its frequency to twelve. The output port of this divider 227 is connected to one of the two input ports of a third 2:1 multiplexer 229. Under normal timing conditions the divided signal passed on to this input is channeled to the clock input of the +10 counter 225.

The first 2:1 multiplexer 209 has a second input connected to the least significant bit output port a of the +10 counter 205. Multiplexer 209 has a control input k which normally is connected to the logic '0' level supply voltage $V_{SS}$ supply by means of a biased change over push button switch SM. This combination allows manual over-ride of the normal timing conditions. When the switch SM is operated the control input k of multiplexer 209 is connected directly to the $V_{DD}$ voltage supply an held at logic '1' level. In response the output signal from 209 is changed from one of one minute period (i.e. that from output port d of +12 counter 207) to one of one second period (i.e. that from output port a of ÷10 counter 205). In consequence of this change the minute hand index character may be advanced more rapidly, changing from one minute position to the next once every second, until it reaches a desired synchronising position. Since the +12 divider 227 responds immediately to this change, and the third +12 counter 217 responds indirectly through counters 213, 211 the position of the hour hand is thus changed every 12 seconds instead of every 12 minutes and so moves in synchrony with the minutes hand. When the desired synchronising position is reached, the switch SM is released so that normal operating conditions are resumed.

The second and third multiplexers 215, 229 have controlling input ports k each connected to the source of the logic '0' supply voltage $V_{SS}$ through a biased changeover push button switch SH. Both multiplexers 215, 229 have a signal input port, and these ports are connected to the most significant and the least significant bit output ports d and a, respectively, of the +10 counter 205. Thus when the switch SH is closed a logic '1' level voltage is applied to the control port k of both multiplexers 215, 229 and the hour hand index character advanced, independently, from one position to the next, once a second instead of once every twelve minutes, until the switch SH is released.

There now follows a description of a meter display where voltage signals are selected, both for the front-panel electrodes and for the back-panel electrodes, to enable the display of a single index character.

As shown in FIG. 10 the back-plate electrode structure 9 of the display panel 1 comprises a set of ten shaped segment electrodes S0 to S9 arranged uniformly to form a dial. Each segment electrode S0 to S9 is connected to an output pad terminal T0 to T9.

Figure 4:
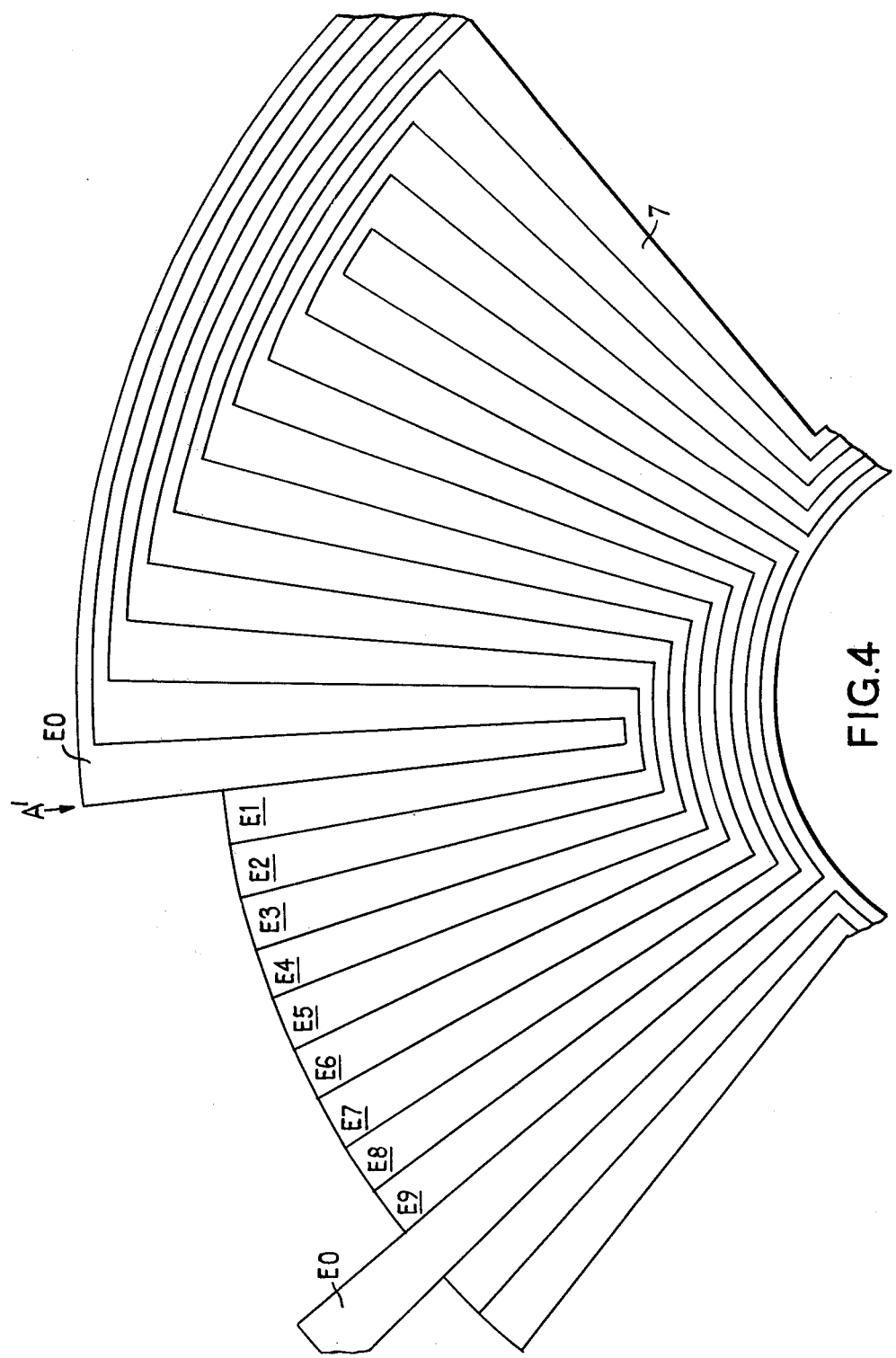
FIG. 4 is a detailed plan showing a portion of a set of front plate electrodes, the electrodes having a modified meander configuration suitable for overlapping the back-plate electrodes shown in detail in FIG. 3.

The front plate electrode structure 7 of the display panel 1 is as shown in FIG. 4 and comprises a circular array of a set of ten meander electrodes E0 to E9. These electrodes overlap the segment electrodes S0 to S9 and are arranged in register as indicated by arrows A', A. This overlap defines one hundred selectable index positions.

Circuitry for operating the display panel of FIGS. 1, 4 and 10 described above, is shown in FIGS. 11a and 11b.

There is shown in FIG. 11a, a signal generator 231, and a signal selector 233. The signal generator 231 comprises a serial in/parallel out 3-bit shift register clocked by a clock generator CP at a frequency typically $\geq 200$ Hz to avoid flicker with feedback through logic components, namely, an exclusive OR gate 237, an OR gate 239 and a triple input NOR gate 241. The exclusive OR gate 237 is connected to the first and third bit output lines L0, L2 of the register 235 and, through the OR gate 239, controls the shift register 235. The triple input NOR gae 241 is connected to all three bit output lines L0, L1, and L2, and, also feeds the OR gate 239. On initiation, the latter combination of the OR gate 239 and the NOR gate 241 ensures a logic '1' is loaded first into the first bit of the register on the first clock edge. The generator 231 produces three different signals as shown in Table 3 below:

TABLE 3

| | | Coded Signal Sequence | | | | | | |
|---|---|---|---|---|---|---|---|---|
| Output signals | L0 | 1 | 1 | 1 | 0 | 1 | 0 | 0 |
| on lines | L1 | 0 | 1 | 1 | 1 | 0 | 1 | 0 |
| L0, L1, L2 | L2 | 0 | 0 | 1 | 1 | 1 | 0 | 1 |

The RMS voltage difference for these signals is $\sqrt{(4/7)} \cdot V$, where V is the difference between the logic level '1' and level '0' voltages and the difference between any two of these three signals is AC.

Since only 3 signal waveforms are required, an even simpler arrangement is possible. The exclusive OR gate 237 may have its inputs connected to L0 and L1 and the 3 input NOR gate 241 replaced by a 2 input NOR gate with its inputs connected to L0 and L1. Under these circumstances the clock frequency can be reduced to about 75 Hz without flicker being observed and, with CMOS electronics, a power saving may be obtained.

The signals generated by this arrangement are as shown in Table 3a below.

TABLE 3a

| | | Coded Signal Sequence | | |
|---|---|---|---|---|
| Output signals | L0 | 1 | 1 | 0 |
| on lines | L1 | 0 | 1 | 1 |
| L0, L1 and L2 | L2 | 1 | 0 | 1 |

The RMS voltage difference for these signals is $\sqrt{(2/3)} \cdot V$ where V is as defined above. This value is significantly higher than $\sqrt{(4/7)}V$ and allows a lower level of drive voltages for the same RMS voltage difference. The voltage difference between any two signals is again AC. Either of the above methods can be used to generate the driving signals for the display the remainder of figures 11a and 11b remaining unchanged.

The signal selector 233 comprises two sets of ten 2:1 multiplexers {300 to 309}, {310 to 319}. Each multiplexer {300 to 309} has a control input port d0 to d9 and is connected at its signal input ports to both of the signals lines L1, L2. Collectively, multiplexers 300 to 309 control the channeling of the signals on the lines L1, L2 to the meander electrodes E1 to E9, E0. It is arranged that when a logic '1' level voltage is addressed to one of the control input ports d0 to d9, the signal on line L1 is channeled to the corresponding electrode E1 to E9, E0, while all other controlling input ports d0 to d9 are held at logic '0' level and the signal on line L2 is channeled to all other meander electrodes E1 to E9, E0. Each multiplexer 310 to 319 has a controlling input port c0 to c9, and is connected at its signal input ports to lines 10, L1. Each multiplexer 310 to 319 is connected at its output channel to one of the terminals T0 to T9, respectively. The signal on line L1 is channeled to one of these terminals T0 to T9 and thus to one of the segment electrodes S0 to S9, when a logic '1' voltage level is applied to the corresponding control input port c0 to c9, respectively. According therefore, to the addresses applied to the sets of control input port {d0 to d9}, {c0 to c9}, the signal on line L1 is applied to both a selected one of the meander electrodes, E1 to E9, E0 and, to a selected one of the segment electrodes S0 to S9, and develops a zero voltage difference across the region of the display panel where these selected electrodes overlap. The signal on line L2 is channeled to all other meander electrodes, and the signal on line L0 is channeled to all other segment electrodes so that a finite voltage difference is developed across all other regions of the display panel where the segment, and the meander, electrodes overlap. In consequence, an index character appears at a position corresponding to the overlap of the two selected electrodes, and, corresponding to a region of the display panel 1 where the medium 11 is in the OFF state, in optical contrast against the background of the display panel 1 corresponding to the regions of the medium 11 which are all in the ON state.

The control signals for operating the multiplexers 300 to 309, and 310 to 319 are provided by data processing circuitry shown in FIG. 11b. This circuitry comprises: a source of BCD data having "tens" and "units" 4-bit data output ports a to d; a pair of 1:10 demultiplexers 283A, 283B both receiving digital input signals from an output port d, ie the port corresponding to the least significant bit of the "tens" 4-bits, the latter demultiplexer 283B being connected to this port d through an inverting amplifier 284; a further 1:10 demultiplexer 285; and, ten OR gates 290 to 299. All of the outputs of demultiplexers 283A, 283B and 285, except those selected by control address, are at logic level '0'. The demultiplexers 283A, 283B determine the control signal address for the meander electrodes E1 to E9, E0 according to the coding of the logic signals, on the "units" output ports a to d, which are fed to both of these four control inputs. These demultiplexers 283A, 283B have output channels a0 to a9, and b0 to b9 and, onto one of these, a logic '1' level voltage is channeled. To compensate for the meander of the electrodes E1 to E9 about electrode E0, the output channels a0 to a9, b0 to b9 are connected to OR gates 290 to 299 in pairs: a0 and b0; a9 and b1; a8 and b2; a7 and b3; a6 and b4; a5 and b5; a4 and b6; a3 and b7; a2 and b8; and a1 and b9.

The output channels of the OR gates 290 to 299 are connected to the control inputs d0 to d9 of the first set of 2:1 multiplexers 300 to 309. The further demultiplexer 285 is controlled by the "tens" output of the source 281 and has a single signal input held at the supply logic level '1' voltage $V_{cc}$. It has ten output channels each one of which is connected to one of the control inputs c0 to c9 of the second set of 2:1 multiplexers 310 to 319.

I claim:

1. An analogue display including:
   a display panel having an electrically sensitive medium interposed between a first and a second set of electrodes, each set mounted upon a supporting substrate, at least one of which substrates is transparent, the medium being capable of adopting in different regions thereof each of two optical states, an ON state and an OFF state respectively, according to voltage differences applied thereacross when address signals are applied to the electrodes, the two sets of eletrodes being arranged in register with each other and each configured to define by overlap thereof both a plurality of selectable positions of a shaped index character and background areas adjacent these selectable positions;
   panel drive means for providing a set of address signals; and,
   signal selection means having signal inputs connected to the panel drive means to receive address signals, and having at least one control input, the selection means being connected to at least one of the two sets of electrodes; the other set of electrodes being connected to receive address signals wherein, under control, the selection means is capable of channelling selected address signals to its connected electrodes, such that while address signals are applied to both sets of electrodes, like signals are applied to overlapping electrodes defining a selected one of the selectable positions, zero voltage difference being applied across the region of the medium interposed therebetween, this region being held in the OFF state, where simultaneously other regions of the medium, corresponding both to other selectable positions of the index character and to background areas, are held in the ON state.

2. A display according to claim 1 wherein the electrically sensitive medium is of liquid crystal material.

3. A display according to claim 2 wherein the panel includes two polarizers, the surface of the electrodes being treated and the polarisers aligned, the panel being arranged thus as a twisted nematic device.

4. A display according to claim 2 wherein the liquid crystal material is cholesteric and the surface of the electrodes treated, the panel being arranged thus as a phase change device.

5. A display according to claim 4 wherein the cholesteric material includes a pleochroic dye.

6. A display according to claim 5 wherein the dye is an anthraquinone dye having the formula:

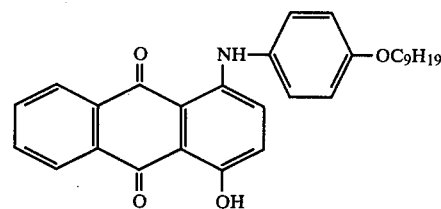

7. A display according to claim 4 wherein the cholesteric material includes at least one azodye selected from a group of azodyes having the formulae:

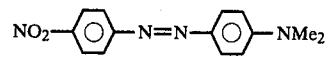

-continued

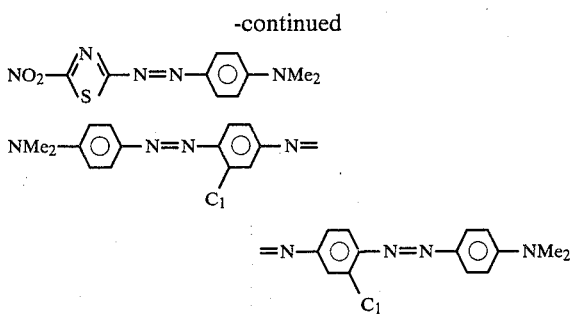

8. A display according to claim 1 wherein the first set of electrodes includes electrodes arranged in a meander configuration, and the second set of electrodes is arranged in a segmented configuration.

9. A display according to claim 8 wherein the first set of electrodes consists of electrodes arranged in a meander configuration and other electrodes interposed each between a fold formed by the electrodes arranged in the meander configuration.

10. A display according to claim 8 wherein the first set of electrodes is divisible into, and connected as, a plurality of independant subsets, and the second set of electrodes is configured for providing index characters of different shape, the two sets of electrodes overlapping to define a plurality of selectable positions each plurality thereof corresponding to a different shape of index character each associated with a corresponding one of the subsets, the electrodes being connected to receive address signals so that like signals are applied in each case to overlapping electrodes defining for each shape of index character a selected one of the selectable positions, enabling index characters of different shape to be displayed simultaneously at corresponding regions of the medium held in the OFF state.

11. A display according to claim 1 wherein one set of electrodes is connected to the selection means, and the other set of electrodes is connected to the drive means.

12. A display according to claim 1 wherein both sets of electrodes are connected to the selection means.

13. A display according to claim 1 wherein the RMS voltage difference between any two address signals applied to the panel is in each case significantly greater than that threshold voltage that is characteristic of the panel medium.

14. A display according to claim 13 wherein the RMS voltage difference between any two address signals applied to the panel is the same in each case.

15. A display according to claim 14 wherein the common RMS voltage difference between address signals as applied to the panel is greater than that saturation voltage characteristic of the panel medium.

16. A display according to claim 13 wherein each address signal is a binary coded signal, the voltage difference between any two signals being truly ac and of repetitive period of sufficiently short duration that the medium responds to the RMS value of each voltage difference.

17. A display according to claim 16 wherein the set of address signals, provided by the drive means, consists of a number N of address signals, the set being a pseudorandom binary sequence of signals, each signal characterised by a code repeated in a common period of time $T$, each signal in period T being divided into a number L of bits, this number L being greater than or equal to the number N.

18. A display according to claim 1 including control means connected to the selection means.

19. A display according to claim 18 wherein the control means includes a transducer responsive to a physical variable, and selection control means responsive to the transducer, connected to the signal selection means, providing for control of the selection of address signals to give meter indication on the display panel of a measure of the physical variable.

20. A display according to claim 18 wherein the control means includes: an oscillator; a divider chain connected to the oscillator, for providing time division signals; and, processing logic means connected to the divider chain to receive the time division signals, and connected to the signal selection means, providing for control of the selection of address signals to give time function indication on the display panel.

21. A display according to claim 20 wherein said display comprises a timepiece, said first set of electrodes including electrodes arranged in a meander configuration, said second set of electrodes including electrodes arranged into twelve shaped segments, the sets of electrodes providing by their overlap three pluralities of selectable positions each of a shaped index character and background areas adjacent thereto, the shaped index character corresponding to each plurality of selectable positions being of difference shape and associated with a different one of three subsets of the first set of electrodes, the first shape being a short hand, the second shape a long hand, and the third shape a peripheral mark, for indication of the hour, minute and second functions of time; said panel drive means being connected to the second set of electrodes; said signal selection means being connected to the first set of electrodes; and said processing logic means being operative to control the selection of address signals to give indication of the three functions of time simultaneously on the display panel.

* * * * *